(12) United States Patent
Birner et al.

(10) Patent No.: US 8,399,936 B2
(45) Date of Patent: Mar. 19, 2013

(54) THROUGH SUBSTRATE VIA SEMICONDUCTOR COMPONENTS

(75) Inventors: Albert Birner, Regensburg (DE); Uwe Hoeckele, Regensburg (DE); Thomas Kunstmann, Laaber (DE); Uwe Seidel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 419 days.

(21) Appl. No.: 12/790,220

(22) Filed: May 28, 2010

(65) Prior Publication Data
US 2010/0230818 A1 Sep. 16, 2010

Related U.S. Application Data

(62) Division of application No. 12/135,059, filed on Jun. 6, 2008, now Pat. No. 7,772,123.

(51) Int. Cl.
*H01L 29/76* (2006.01)
*H01L 29/94* (2006.01)
*H01L 31/062* (2006.01)
*H01L 31/119* (2006.01)

(52) U.S. Cl. .......... 257/396; 257/288; 257/E21.17; 257/E21.267; 257/E21.304; 257/E21.324; 257/E21.577; 257/E21.585; 257/E21.646

(58) Field of Classification Search ........... 257/396, 257/288, 506, 622, 647, 649, 774, E21, 17, 257/E21.267, E21.304, E21.577, E21.585, 257/E21.646
See application file for complete search history.

(56) References Cited

U.S. PATENT DOCUMENTS

| | | |
|---|---|---|
| 5,424,245 A | 6/1995 | Gurtler et al. |
| 5,493,096 A | 2/1996 | Koh |
| 5,501,893 A | 3/1996 | Laermer et al. |
| 5,599,744 A | 2/1997 | Koh et al. |
| 5,679,978 A | 10/1997 | Kawahara et al. |
| 6,150,252 A | 11/2000 | Hsu et al. |
| 6,333,265 B1 | 12/2001 | Dixit et al. |
| 6,589,865 B2 | 7/2003 | Dixit et al. |
| 6,821,896 B1 | 11/2004 | Shih |
| 6,861,312 B2 | 3/2005 | Birner et al. |
| 6,908,841 B2 | 6/2005 | Burrell et al. |
| 6,919,255 B2 | 7/2005 | Birner et al. |
| 7,772,123 B2 * | 8/2010 | Birner et al. .............. 438/700 |
| 2005/0121711 A1 | 6/2005 | Pogge et al. |
| 2005/0121768 A1 | 6/2005 | Edelstein et al. |
| 2006/0273455 A1 | 12/2006 | Williams et al. |
| 2007/0085198 A1 | 4/2007 | Shi et al. |
| 2007/0152194 A1 | 7/2007 | Natekar et al. |
| 2007/0228546 A1 | 10/2007 | So et al. |
| 2008/0061340 A1 | 3/2008 | Heineck et al. |

* cited by examiner

*Primary Examiner* — David Nhu
(74) *Attorney, Agent, or Firm* — Slater & Matsil, L.L.P.

(57) ABSTRACT

A structure and method of forming through substrate vias in forming semiconductor components are described. In one embodiment, the invention describes a method of forming a through substrate via by partially filling an opening with a fill material, and forming a first insulating layer over the first fill material thereby forming a gap over the opening. The method further includes forming a second insulating layer to close the gap thereby forming an enclosed cavity within the opening.

25 Claims, 25 Drawing Sheets

THROUGH SUBSTRATE VIA SEMICONDUCTOR COMPONENTS

This is a divisional application of U.S. application Ser. No. 12/135,059, U.S. Pat. No. 7,772,123 B2, entitled "Through Substrate Via Semiconductor Components," which was filed on Jun. 6, 2008 and is incorporated herein by reference.

TECHNICAL FIELD

This invention relates generally to electronic devices, and more particularly to through substrate via semiconductor components.

BACKGROUND

One of the goals in the fabrication of electronic components is to minimize the size of various components. For example, it is desirable that hand held devices such as cellular telephones and personal digital assistants (PDAs) be as small as possible. To achieve this goal, the semiconductor circuits that are included within the devices should be as small as possible. One way of making these circuits smaller is to stack the chips that carry the circuits.

A number of ways of interconnecting the chips within the stack are known. For example, bond pads formed at the surface of each chip can be wire-bonded, either to a common substrate or to other chips in the stack. Another example is a so-called micro-bump 3D package, where each chip includes a number of micro-bumps that are routed to a circuit board, e.g., along an outer edge of the chip.

Yet another way of interconnecting chips within the stack is to use through-vias. Through-vias extend through the substrate thereby electrically interconnecting circuits on various chips. Through-via interconnections can provide advantages in terms of interconnect density compared to other technologies. In addition to applications in 3D chip stacking, through-via interconnections can be used to increase performance of RF and power devices by providing very low resistive ground contacts to wafer backside and advanced heat sink capability. However, introduction of such interconnects may introduce additional challenges.

The integration of chips in 3D brings forth a number of new challenges that need to be addressed. Hence, what is needed in the art are improved structures and methods of producing structures for 3D chip integration.

SUMMARY OF THE INVENTION

These and other problems are generally solved or circumvented, and technical advantages are generally achieved, by embodiments of the present invention that provide through silicon vias and methods of manufacture thereof.

Embodiments of the invention include methods and structures for forming through substrate vias. In accordance with an embodiment, the invention describes a method of forming the through substrate via by forming a through substrate via by partially filling an opening with a first fill material, and forming a first insulating layer over the fill material thereby forming a gap over the opening. The method further comprises forming a second insulating layer to close the gap thereby forming an enclosed cavity within the opening.

The foregoing has broadly outlined the features of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1d, illustrates a portion of a semiconductor component with a through substrate via comprising a tailored void, wherein FIG. 1a illustrates a cross sectional view, FIG. 1b illustrates a top cross sectional view, and FIGS. 1c and 1d illustrate magnified top cross sectional views, in accordance with embodiments of the invention;

FIG. 2, which includes FIGS. 2a and 2b, illustrates a portion of a semiconductor component with a through substrate via comprising a tailored void, wherein FIG. 2a illustrates a cross sectional view and FIG. 2b illustrates a top cross sectional view, in accordance with embodiments of the invention;

FIG. 3, which includes

FIG. 5, which includes

FIG. 7, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
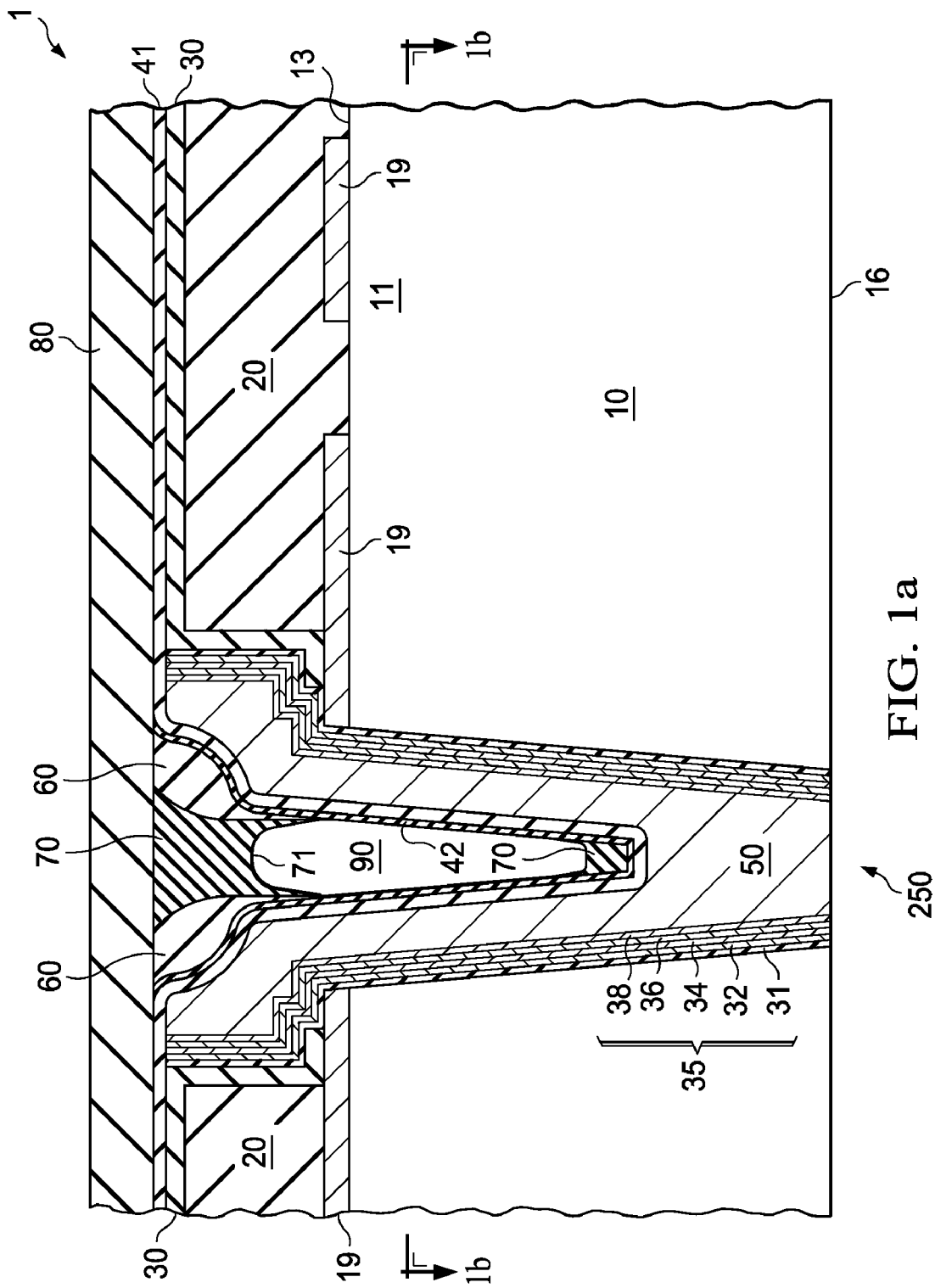
Figure 1B:
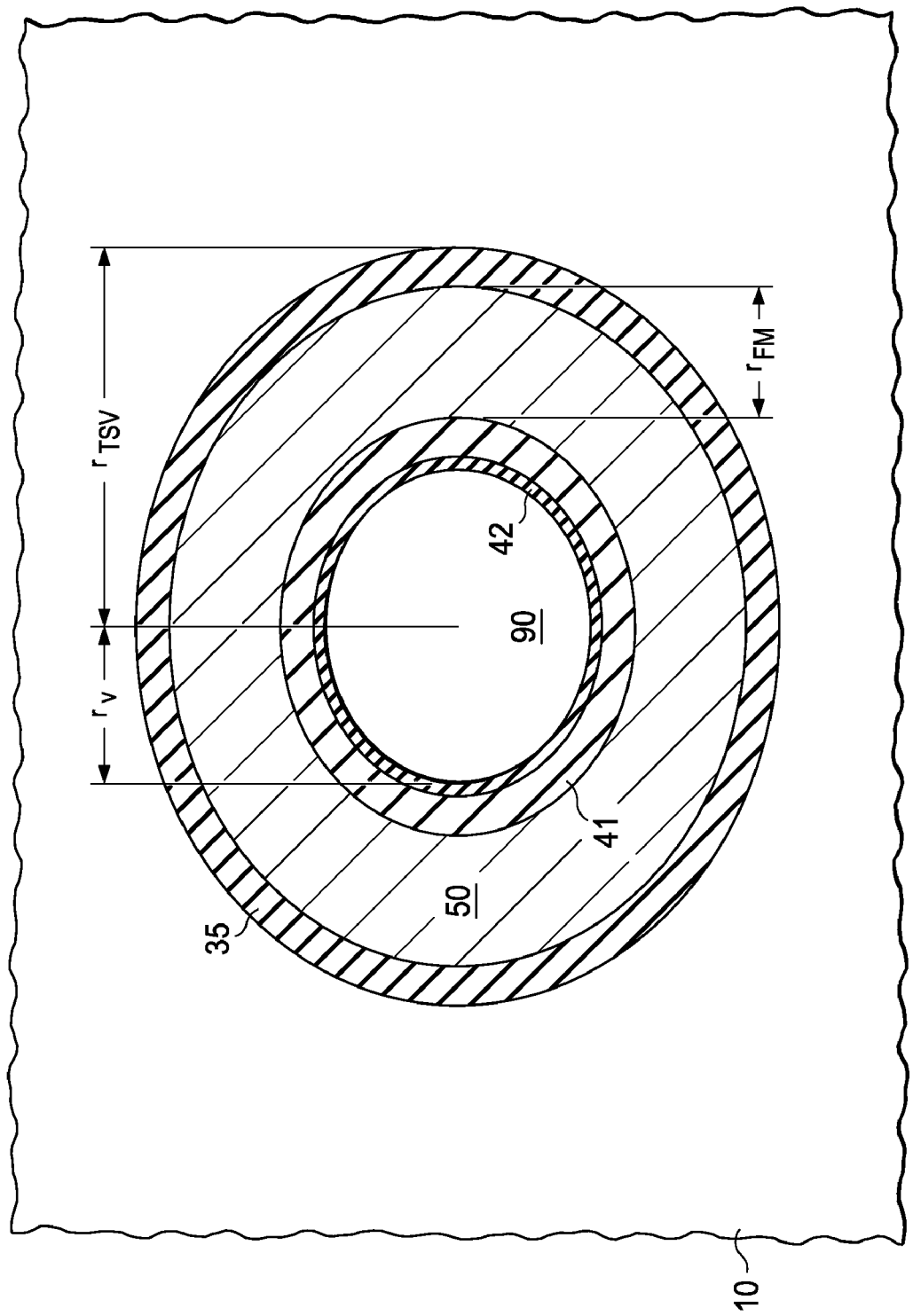

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely partially filled through substrate vias. The invention may also be applied, however, to other semiconductor components comprising, for example, multiple chips and/or in forming voids or micro-voids in other components. One of ordinary skill in the art will be able to recognize further examples as well.

Embodiments of the present invention utilize through substrate vias to create 3D chip packages. Stacking chips on top of one another provides a means to achieve density, increased functionality, and/or additional performance. One way to realize the full benefits of chip stacking is to connect the chips using deep, or through substrate vias. These vias extend from the active circuitry at one face of the chip to a bottom surface of the chip. However, forming through substrate vias is challenging not only during the fabrication of these through substrate vias but also during subsequent processing and/or product lifetime.

One of the key problems associated with stacking such devices arises from yield loss arising from stress induced failure of the product. In various embodiments, the present invention overcomes these limitations by forming through substrate vias comprising voids that are tailored to minimize stress concentration.

A significant difference in coefficient of thermal expansion between the substrate and the fill material in a through substrate via can create large stress concentration around the through substrate via, for example, during subsequent thermal processing. Such increased stress can result in significant yield loss arising from cracks, de-lamination, via collapse, as well as dislocations, stacking faults in the substrate, etc. Metals typically expand faster than silicon thus creating regions of high compressive stress in the substrate as well as inside the fill material.

In various embodiments, the present invention overcomes these problems by reducing stress around the through substrate via by filling the through substrate via with an effective material with minimal thermal expansion. In various embodiments, the effective material comprises a combination of metal and voids. For example, metals typically expand faster than silicon, whereas voids, for example, filled with a gas having negligible expansion relative to the silicon substrate. Hence, a combination of metal with voids produces an effective material with a coefficient of expansion comparable to the substrate. In one embodiment, this effective material comprises a void tailored to specific dimensions and shape, the void forming an inner core region of the through substrate via, while a conductive fill material forms an outer layer of the through substrate via.

Structural embodiments of the invention will be first described using FIGS. 1-2. Various embodiments of the method of fabrication will then be described using the flow charts of FIGS. 4, 6 and 8, and FIGS. 3, 5 and 7.

An embodiment of the invention is illustrated in FIG. 1. FIG. 1a illustrates a cross sectional view of a through substrate via, FIG. 1b illustrates a top cross sectional view of the through substrate via, and FIGS. 1c and 1d illustrate magnified top cross sectional views of the through substrate via.

eferring to FIG. 1a, the substrate 10 comprises a top surface 13 and a lower surface 16. The active regions 11 are disposed on the top surface 13 and comprise devices such as transistors, resistors, capacitors, diodes, etc. (not shown). Metallization levels are disposed over the top surface 13 of the substrate 10.

A inter level dielectric (ILD) layer 20 is disposed above the substrate 10. In one embodiment, the ILD layer 20 comprises a silicon glass layer such as a BPSG layer. In another embodiment, the ILD layer 20 comprising multiple dielectric layers is disposed above the substrate 10. The ILD layer 20 comprises multi level metallization and forms the back end of the line circuitry.

A through substrate via 1 formed by filling a through substrate opening 250 with a fill material 50 is disposed inside the substrate 10. The through substrate opening 250 comprises a high aspect ratio opening in the substrate. In various embodiments, the depth of the through substrate opening 250 is around 50-150 um, while the diameter of the through substrate opening 250 is around 5-15 um. In various embodiments, the aspect ratio of the through substrate opening 250 is about 1:5 to about 1:20. The through substrate via 1 is electrically coupled to the substrate, for example, through electrical metal lines, for example, metal line 19 disposed above the substrate 10.

A first insulating layer 30 is disposed over the ILD layer 20 and forms the sidewalls of the through substrate opening 250. The first insulating layer 30, in one embodiment, comprises a nitride layer.

Figure 1D:
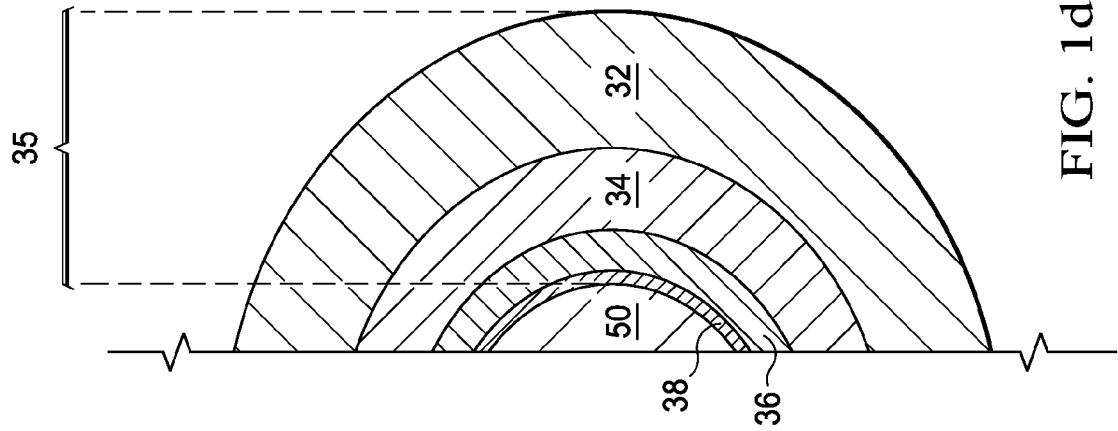
Figure 1C:
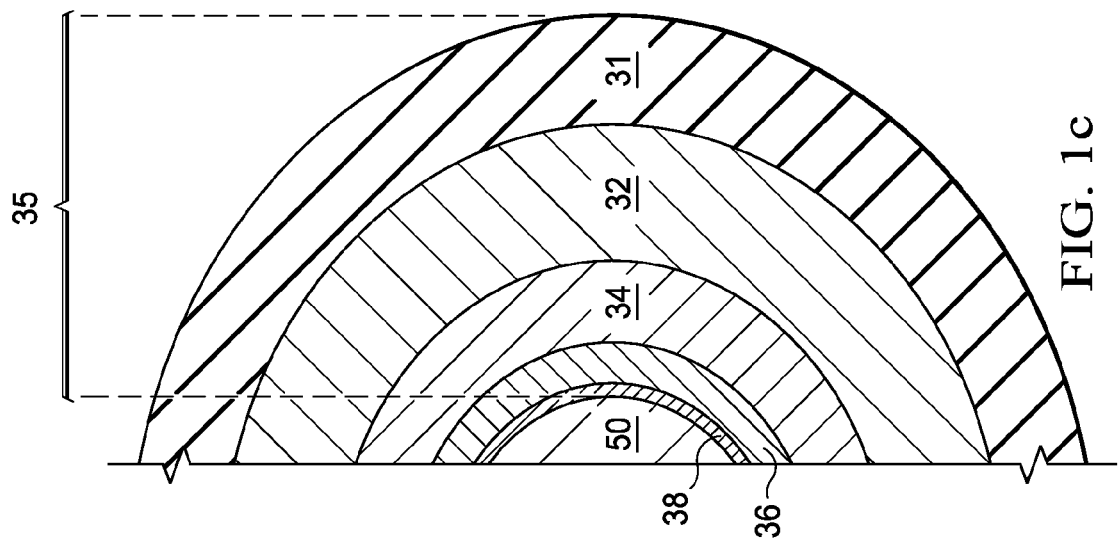

The through substrate opening 250 is lined with a sidewall liner 35 that provides electrical as well as mechanical insulation and support. For example, the outer layer of the sidewall liner 35 comprises a dielectric layer to electrically insulate the active regions 11 from the through substrate via 1. Further, a trench metal liner is disposed over the outer dielectric layer 31. In various embodiments, for example, in applications in which the through substrate interconnect forms a ground contact, the outer dielectric layer 31 is skipped. Hence, in such embodiments, the trench metal liner is directly disposed on the sidewall of the through substrate opening 250. In various embodiments, as illustrated in FIG. 1c, the trench metal liner comprises multiple liners. A first metal liner 32 forms a metal diffusion barrier. Examples of the first metal liner 32 comprise a Ti/TiN layer. A second metal liner 34 comprises a low resistive metal liner such as a tungsten liner. The low resistive metal liner helps to minimize variations during the electroplating process due to resistive loss. A third metal liner 36 comprising a copper barrier is disposed over the second liner. The third metal liner 36, in various embodiments, comprises a TaN layer followed by a Ta layer. A fourth metal liner 38 is disposed over the third metal liner 36. The fourth metal liner 38 comprises a thickness of about 200 to about 500 nm. In various embodiments, the fourth metal liner 38 comprises copper and forms the seed layer.

A fill material 50 partially fills the through substrate opening 250. The fill material 50 covers a part of the through substrate opening 250, leaving a tailored void 90 in the through substrate opening 250. A first dielectric liner 41 is disposed on the sidewalls and bottom surface of the fill material 50. The first dielectric liner 41, in one embodiment, comprises a nitride layer. The first dielectric liner 41 in various embodiments comprises a thickness of about 200 nm to about 500 nm, for example, about 400 nm in one embodiment.

A second dielectric liner 42 is disposed over the first dielectric liner 41. The second dielectric liner 42, in various embodiments, comprises a thickness of about 20 nm to about 150 nm, for example, about 100 nm in one embodiment. In one embodiment, the second dielectric liner 42 comprises a carbon comprising layer, for example, a pyrolytic carbon layer. In other embodiments, other suitable materials that are harder to polish relative to the second dielectric liner 42 can be used. For example, in some embodiments, the second dielectric liner 42 comprises SiN, SiC, or Si.

A second insulating layer 60 is disposed on the corner or edges of the through substrate opening 250. The second insulating layer 60 is disposed over the top sidewall of the second dielectric liner 42. The second insulating layer 60, in one embodiment, comprises an oxide material, for example, an oxide formed using a plasma enhanced process using silane.

A third insulating layer 70 is disposed over a top portion of the through substrate opening 250 and seals the through substrate opening 250 forming a tailored void 90 or enclosed cavity. The third insulating layer 70 is preferably a high density plasma based material. In one embodiment, the third insulating layer 70 comprises a high density plasma based oxide. Although illustrated to fill a lower portion of the tailored void 90, in various embodiments, the third insulating layer 70 only seals the top portion of the tailored void 90. In various embodiments, the third insulating layer 70 is formed from a high density process that forces the pinch-off point 71 (FIG. 3*f*) to be lowered inside the silicon substrate.

A fourth insulating layer 80 is disposed above the third insulating layer 70. The fourth insulating layer 80 forms a protective barrier and in some embodiments comprises a nitride material.

In various embodiments, the size and shape of the tailored void 90 is adjusted to form a through substrate via with minimum defectivity arising from thermal or other stress related defects. Although, only one through substrate via 1 is illustrated, a through substrate via chip may comprise more than one through substrate via 1.

As manufacturability is a key concern, in various embodiments, after selecting suitable materials, the thickness of the fill material 50 is selected relative to the dimension of the tailored void 90. For example, a fraction of the fill material 50 ($f_{FM}$) may be identified based on the materials selected. For example, in FIG. 1*b*, this fraction of the fill material 50 ($f_{FM}$) is a ratio of thickness of the fill material $r_{FM}$ to the radius of the through substrate opening $r_{TSV}$. The fraction ($f_{FM}$) depends on the relative difference between the coefficient of thermal expansions of silicon ($\alpha_{Si}$), fill material 50 ($\alpha_{FM}$) and the tailored void ($\alpha_V$) as $f_{FM} = (\alpha_{Si} - \alpha_V)/(\alpha_{FM} - \alpha_V)$. Assuming negligible expansion of the tailored void or $\alpha_{DM} \approx 0$, the fraction $f_{FM} = \alpha_{Si}/\alpha_{FM}$. Hence, if copper is the fill material, a suitable fraction is about 30% the radius of the through substrate opening 250 $r_{TSV}$. In other words, a partial fill that covers about 15% of the sidewall of the trench minimizes the stress from thermal expansion. In various embodiments, thicker fill material can be used as stress up to a certain critical limit (e.g., critical shear stress) can be safely accommodated. For example, the stress produced during a small increase in temperature may not be significant. Hence, in various embodiments, a numerical simulator is used to design the shape of the voids. In such embodiments, a suitable thickness is calculated numerically to minimize, for example, stress concentrations during subsequent processing. In some embodiments, a more sophisticated analysis utilizing 2D or 3D simulations using finite element simulators determines the appropriate shape and structure of the tailored void 90 relative to the fill material 50. Such numerical calculations can account for changes in stress in different regions, for example, in the corners. Suitable metrics, such as Von Misses criterion, based on the stress tensor may be used to monitor the stress in the structure.

Figure 2A:
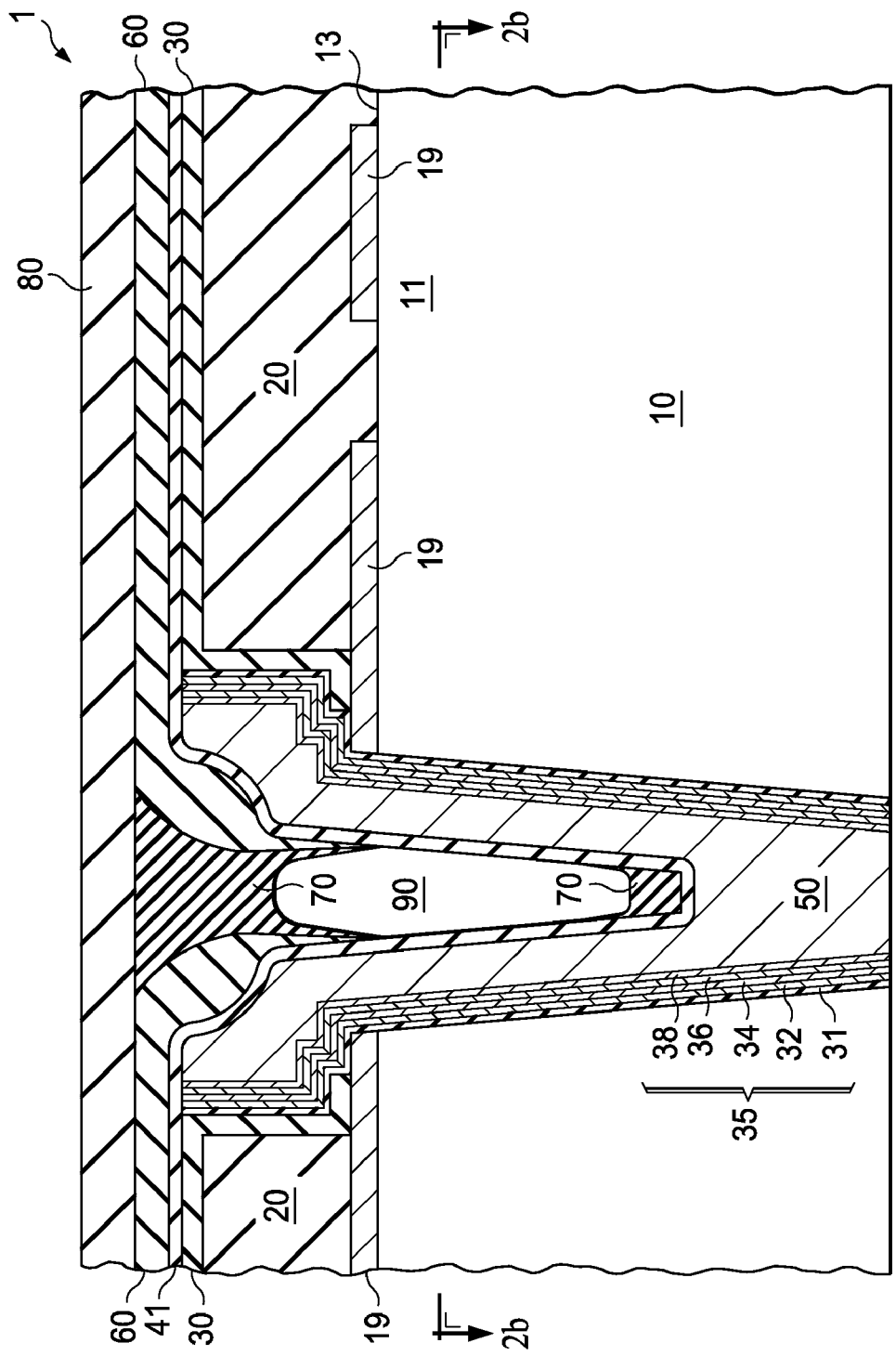
Figure 2B:
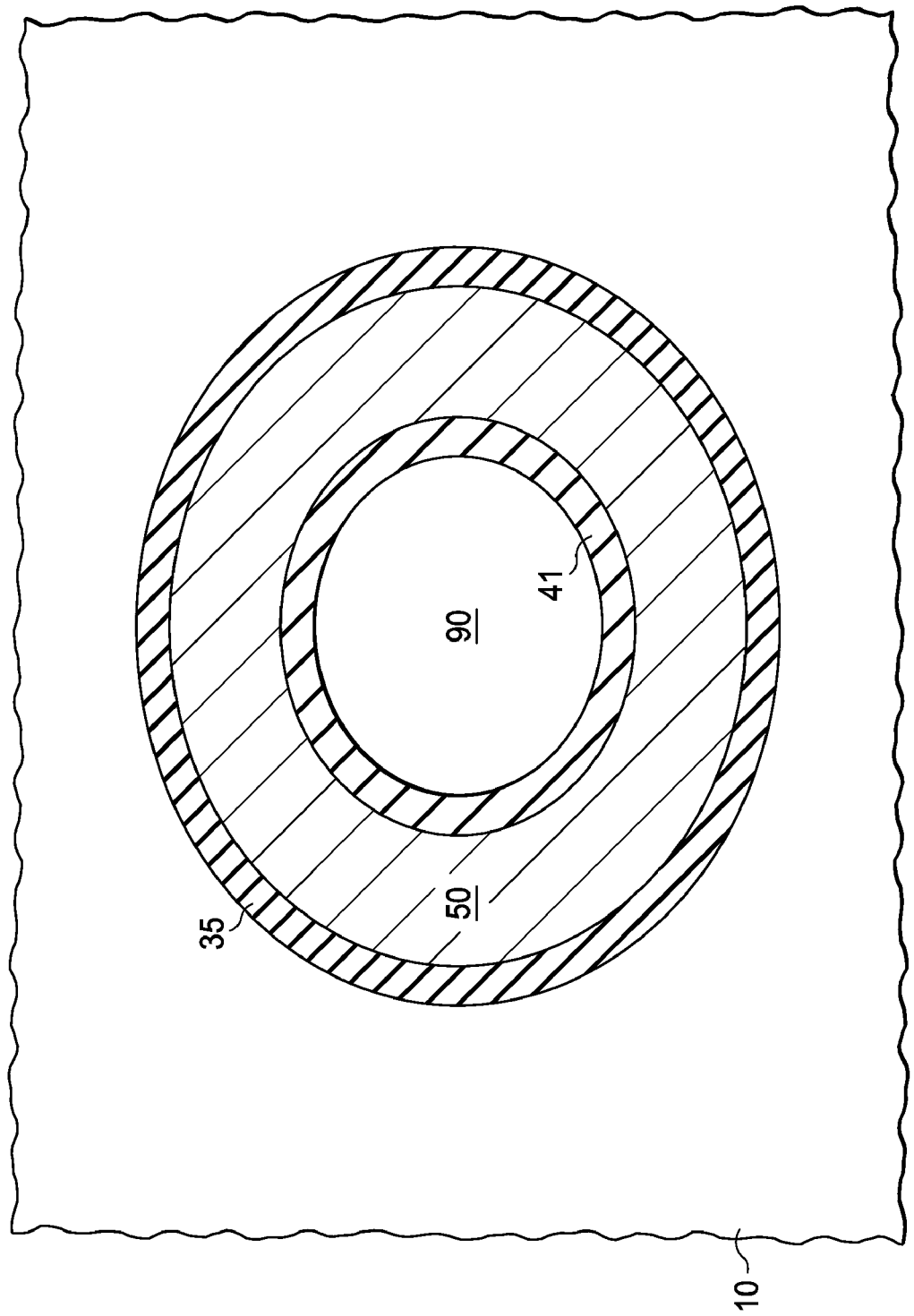

A second structural embodiment is illustrated in FIG. 2, which includes FIGS. 2*a* and 2*b*. FIG. 2*a* illustrates a cross sectional view and FIG. 2*b* illustrates a top view. Unlike the embodiment illustrated in FIG. 1, in this embodiment, the tailored void 90 is lined by the first dielectric liner 41. Hence, unlike the prior embodiment, a second insulating layer 60 is also disposed above the first insulating layer 30.

Figure 3A:
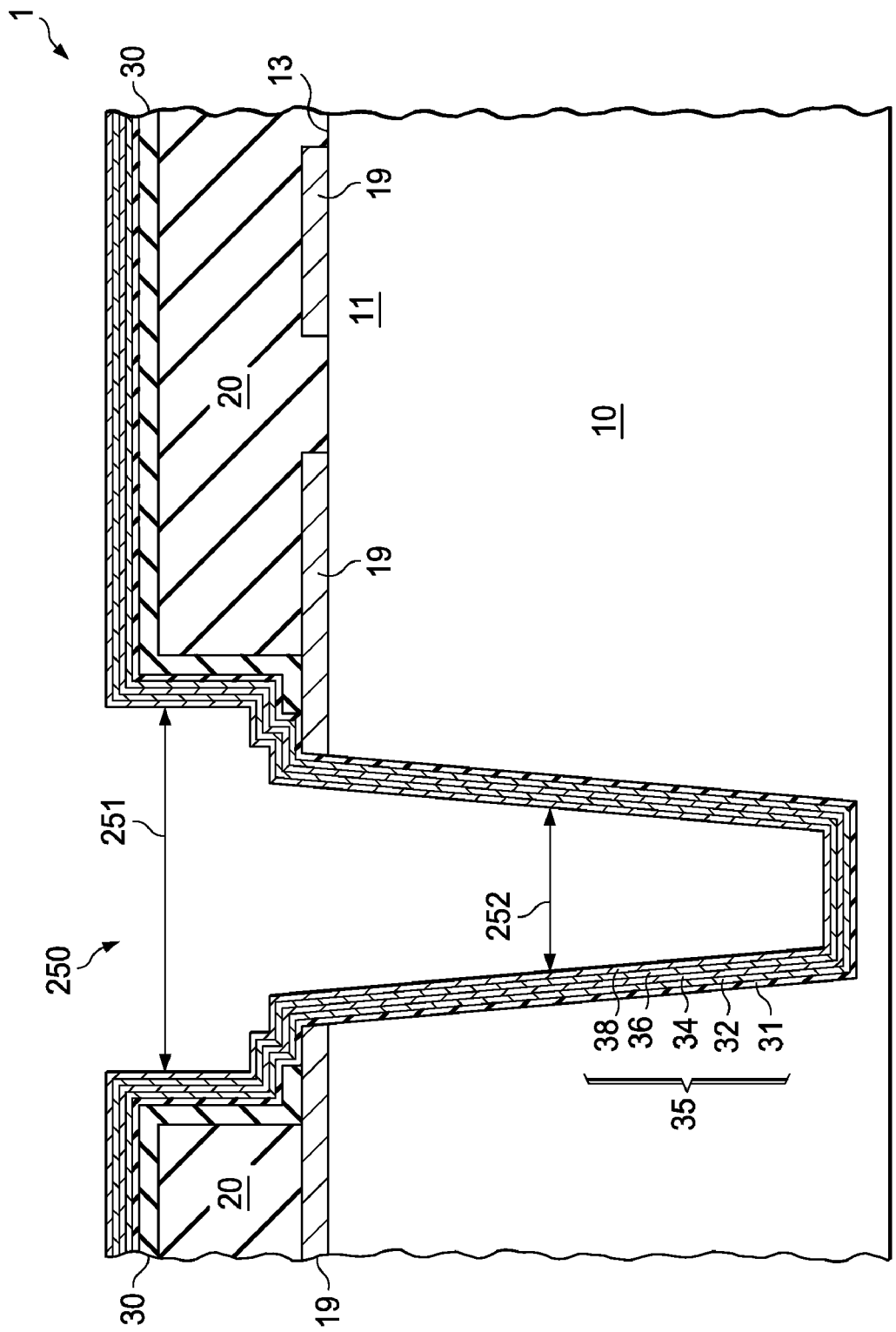
FIGS. 3a-3i, illustrates a method of manufacturing a through substrate via chip, according to embodiments of the invention.
Figure 3B:
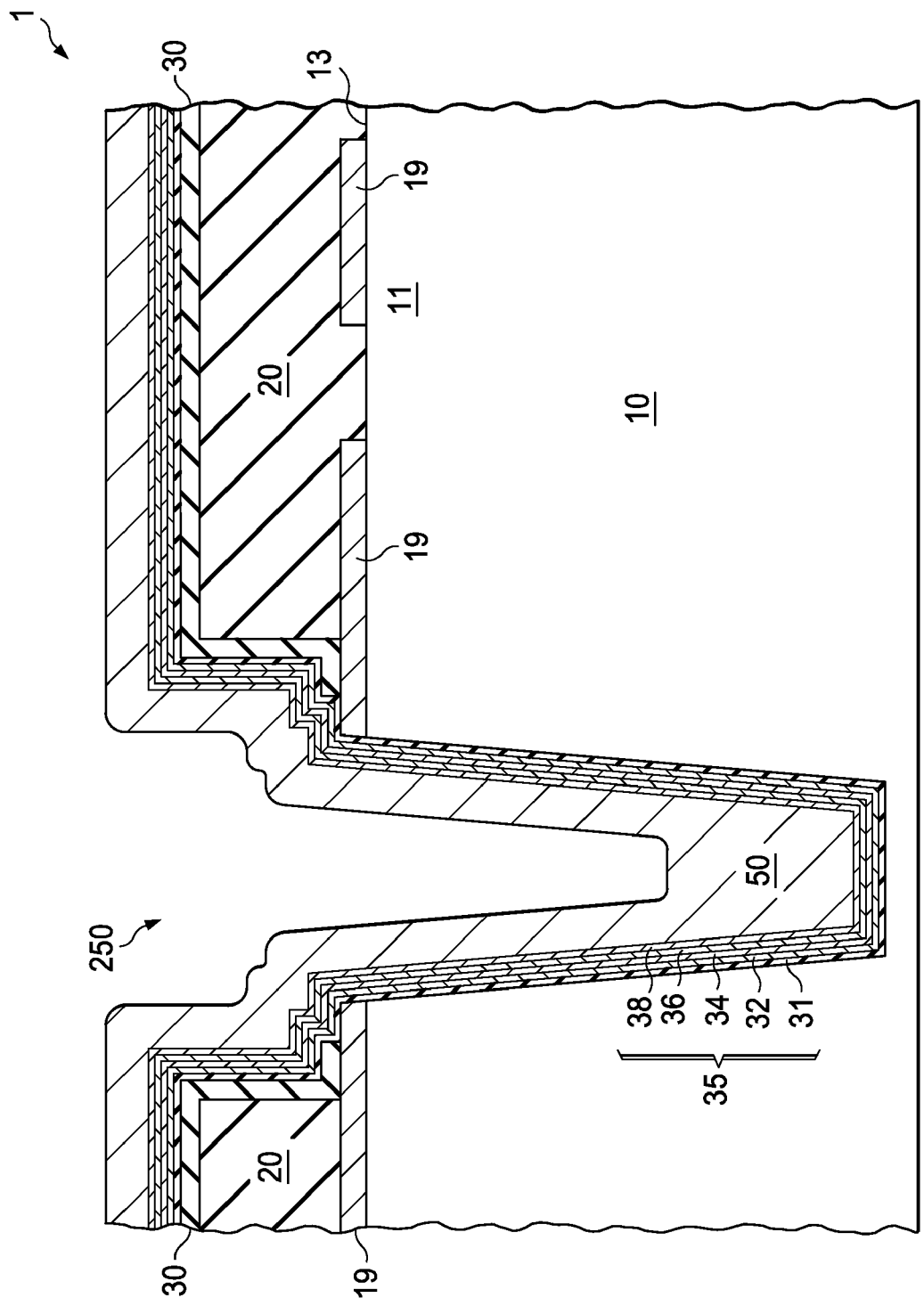
Figure 3C:
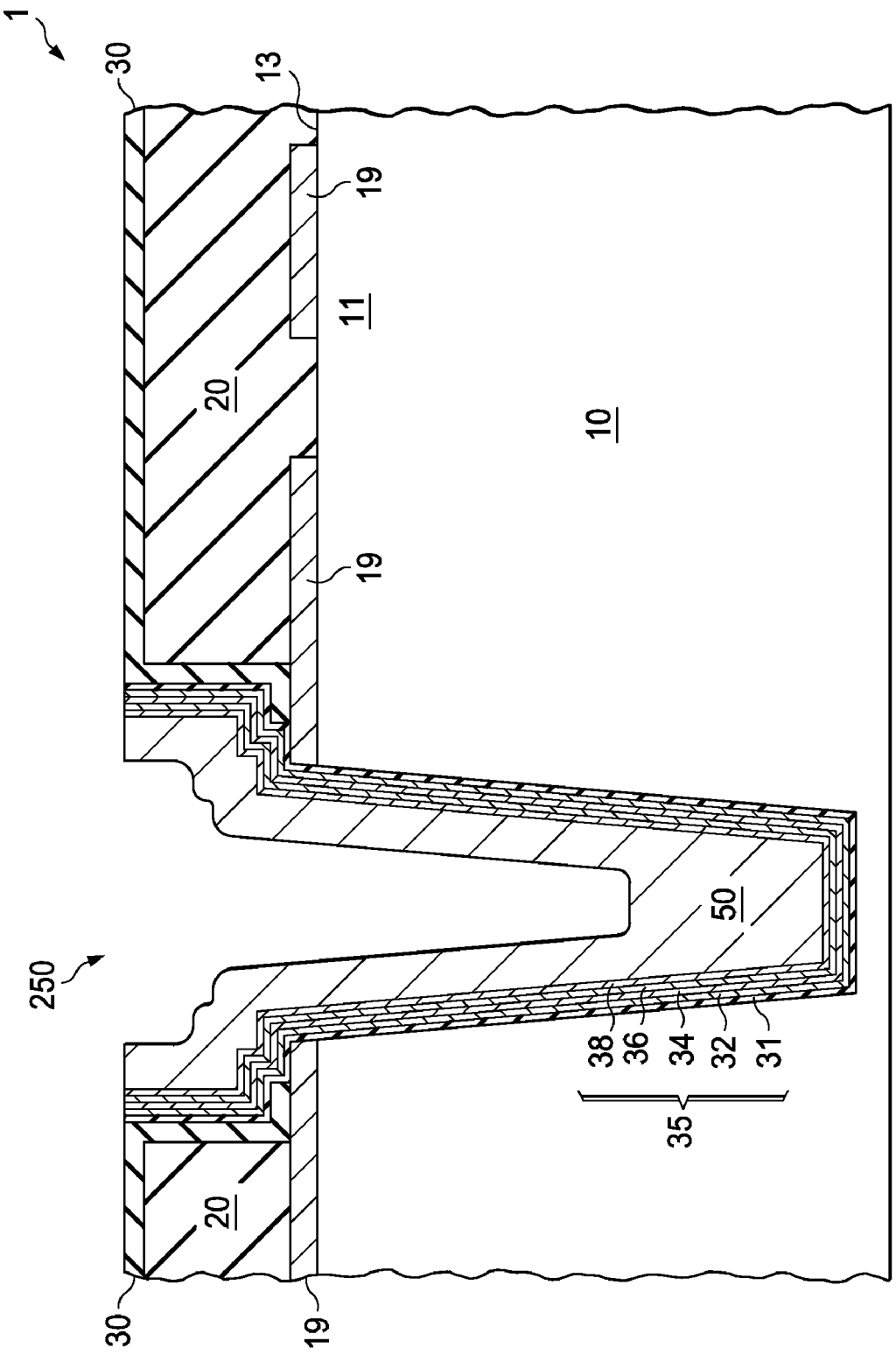
Figure 3D:
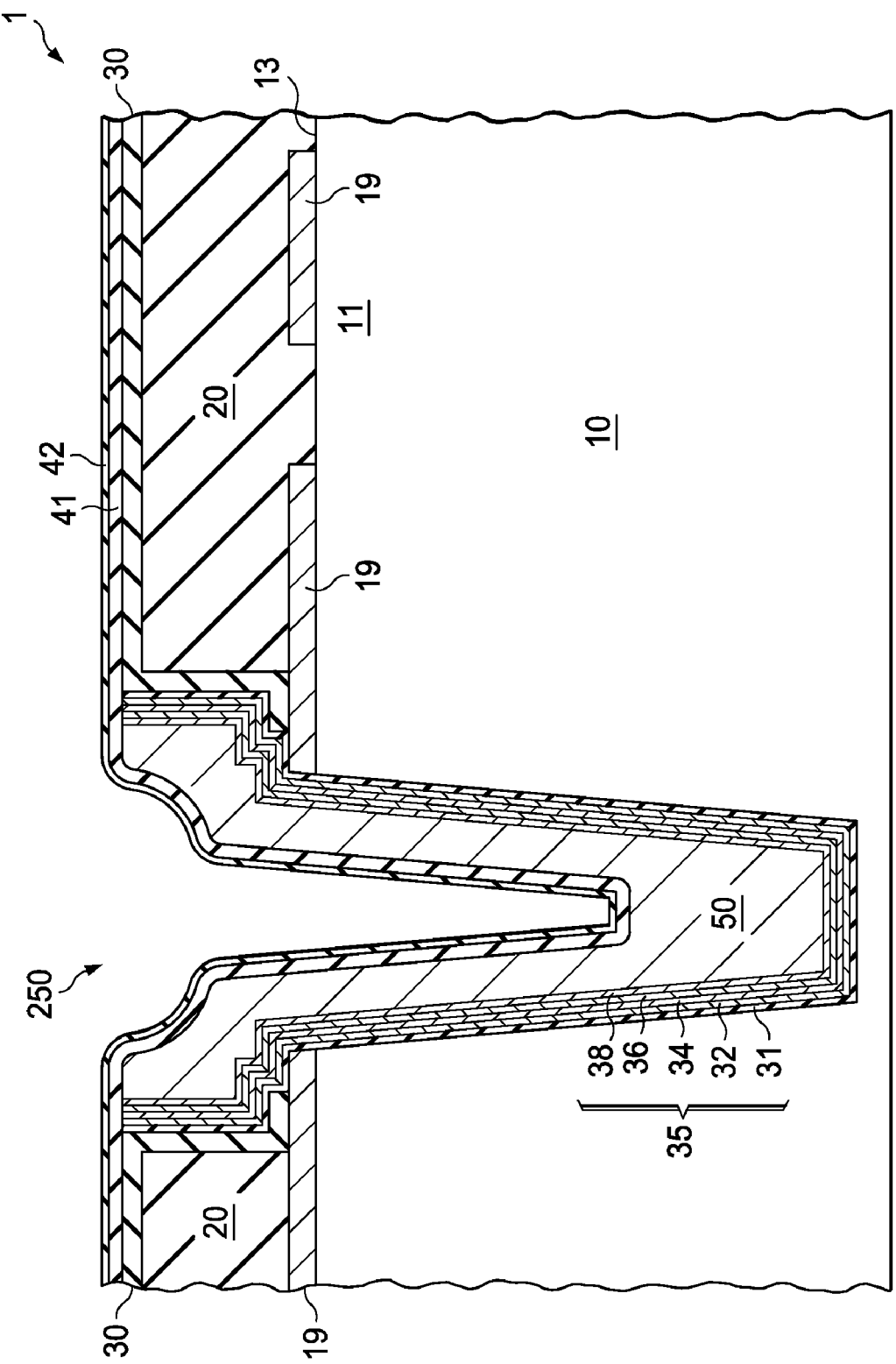
Figure 3E:
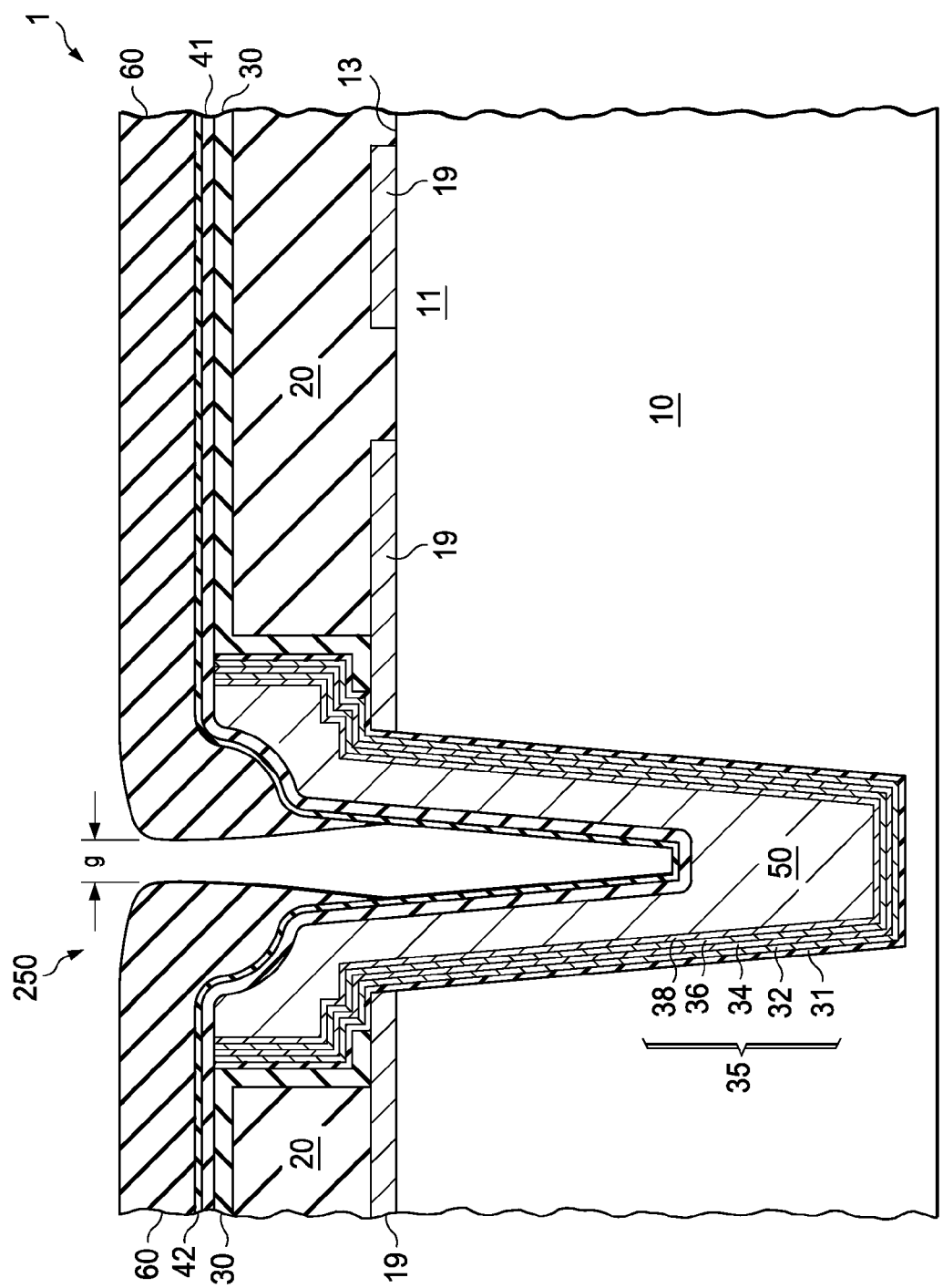
Figure 3F:
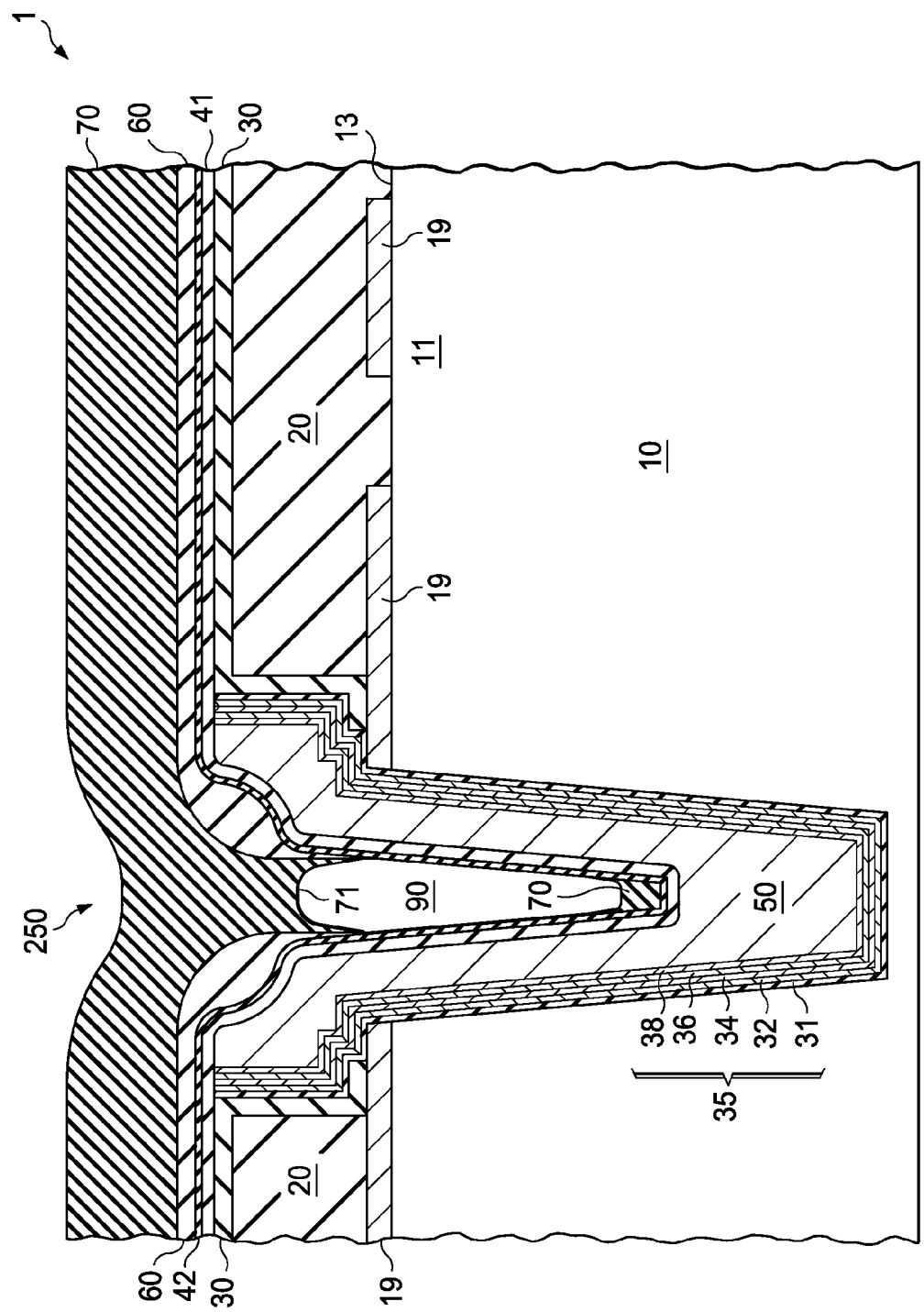
Figure 3G:
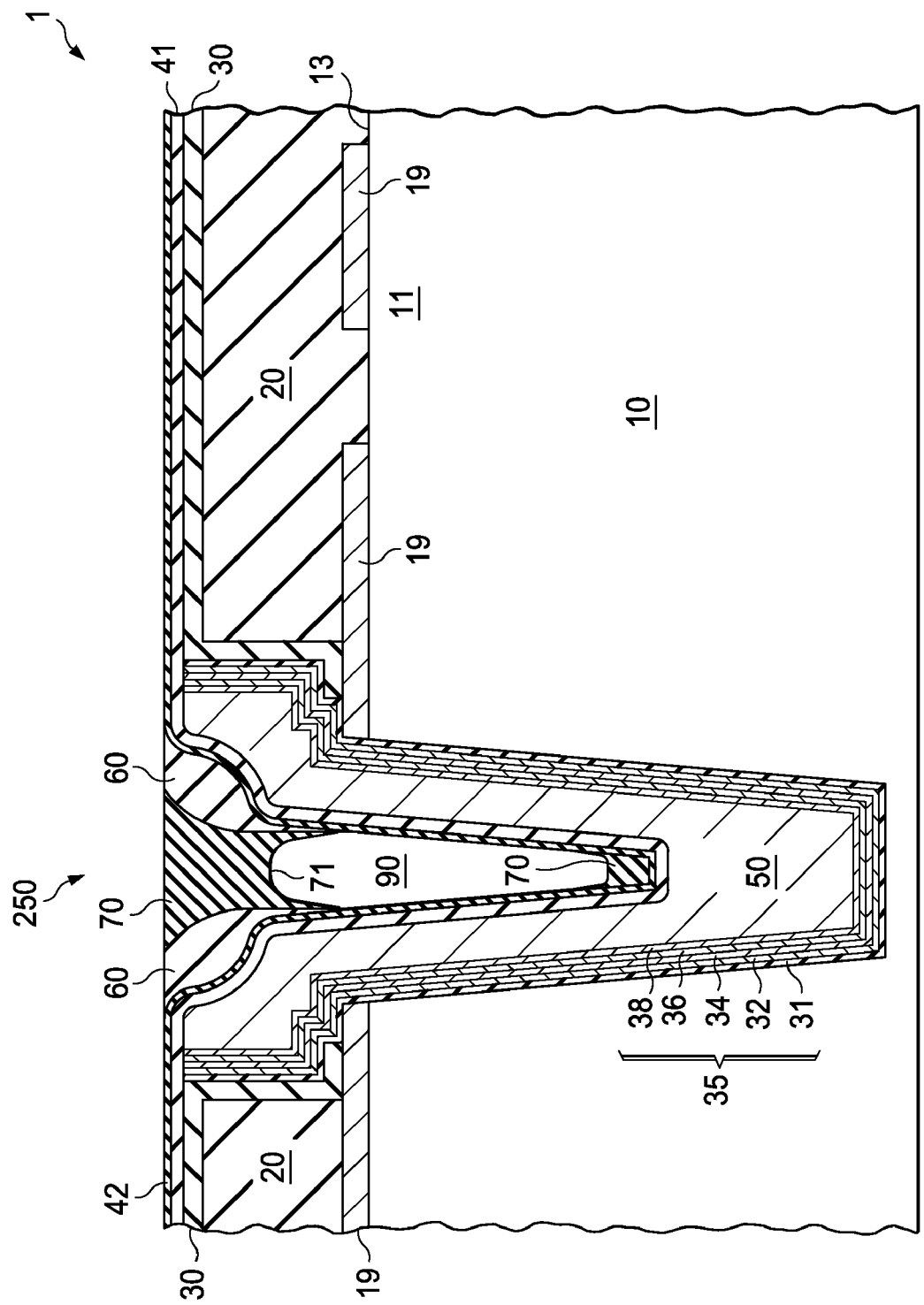
Figure 3H:
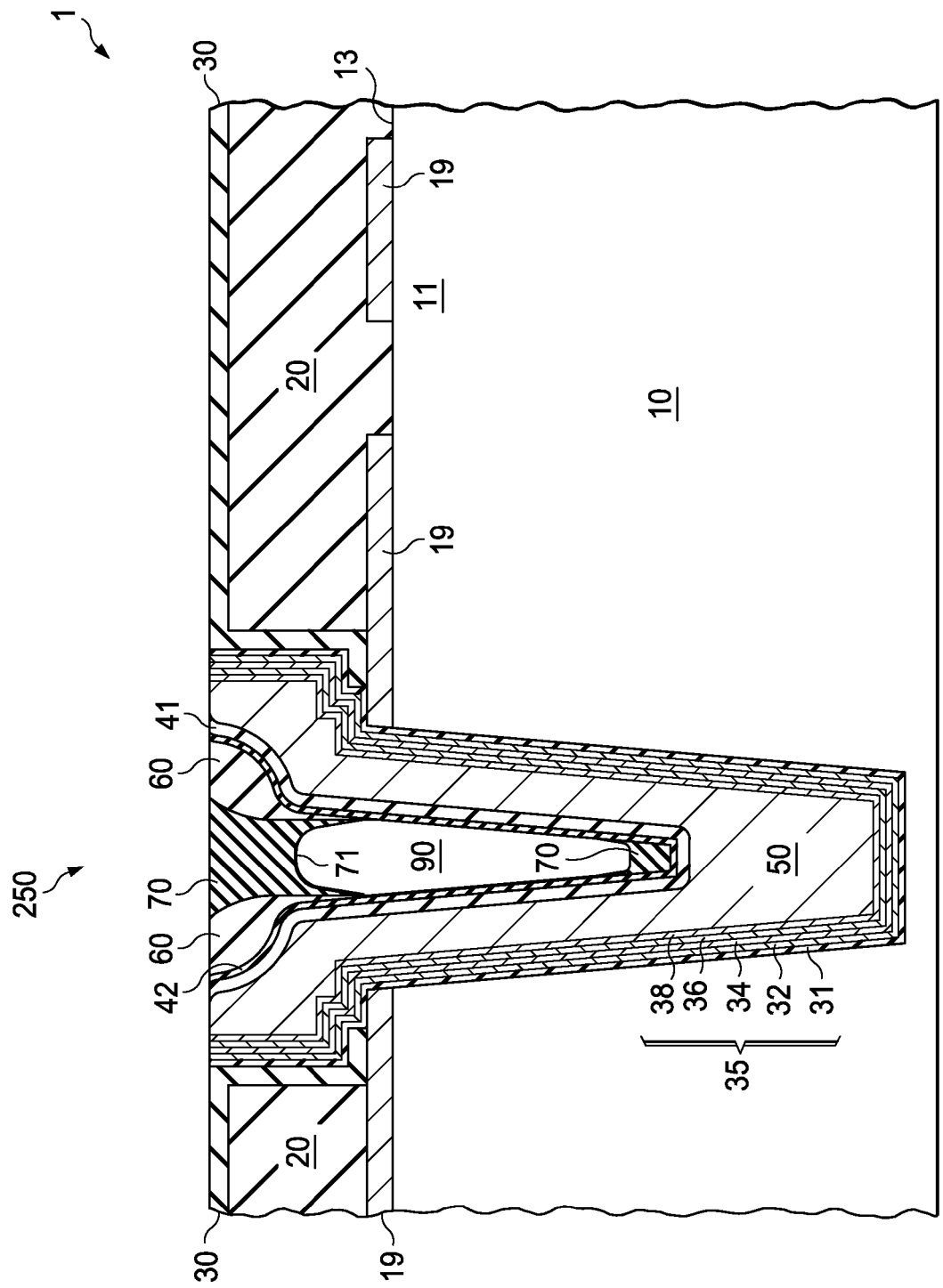
Figure 3I:
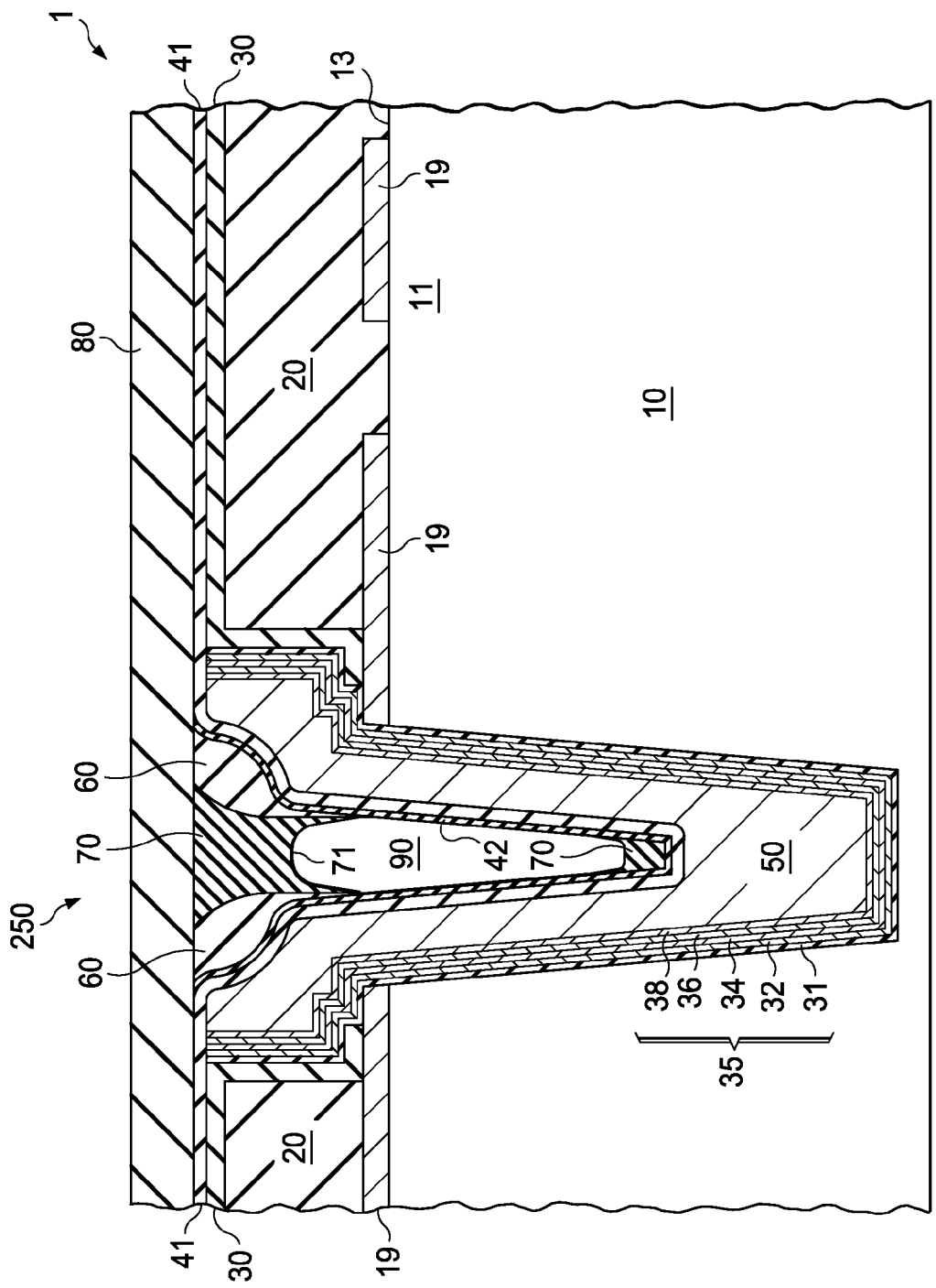
Figure 4:
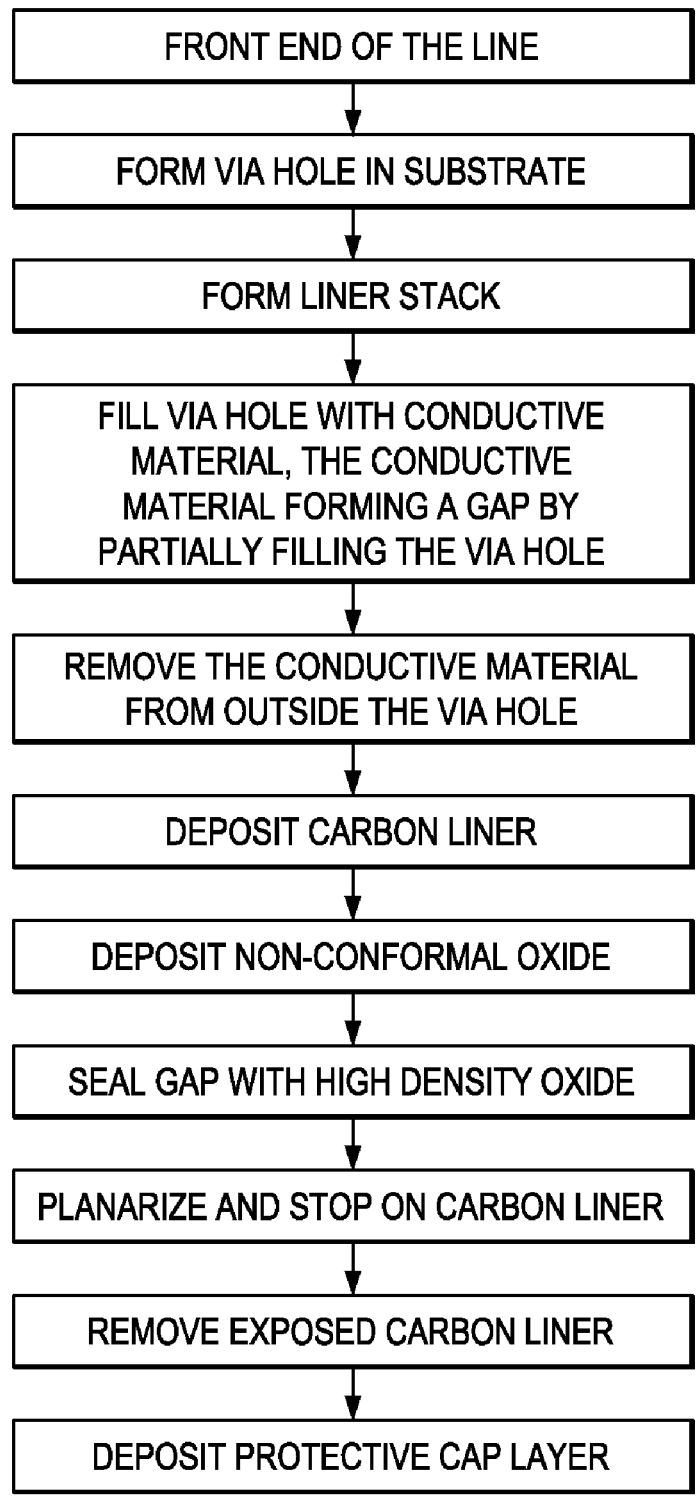
FIG. 4 is a flow chart of a method of forming the through substrate via chip according to an embodiment of the invention.

An embodiment of a method of fabrication of the through substrate via 1 is illustrated using FIG. 3, which includes FIGS. 3*a*-3*h*, and the flow chart of FIG. 4.

Referring to FIG. 3*a*, a through substrate opening 250 is fabricated in a substrate 10. The substrate 10 is typically a semiconductor wafer with active device regions 11. The active device regions 11 or active circuitry can include transistors, resistors, capacitors, inductors or other components used to form integrated circuits. For example, active areas that include transistors (e.g., CMOS transistors) can be separated from one another by isolation regions, e.g., shallow trench isolation. The active device regions are fabricated during the front end of the line processing.

Next, metallization is formed over the active device regions 11 to electrically contact and interconnect the active device regions 11. The metallization and active circuitry together form a complete functional integrated circuit. In other words, the electrical functions of the chip can be performed by the interconnected active circuitry. In logic devices, the metallization may include many layers (e.g., nine or more, of copper). In memory devices, such as DRAMs, the number of metal levels may be less and may be aluminum.

Referring to the flow chart of FIG. 4, the components formed during the front-end process are interconnected by back end of line (BEOL) processing. During this process, contacts are made to the semiconductor body and interconnected using metal lines and vias. As discussed above, modern integrated circuits incorporate many layers of vertically stacked metal lines and vias (multilevel metallization) that interconnect the various components in the chip. In FIG. 3*a*, the back end of the line layer 20 comprising the multilevel metallization is formed over the substrate 10.

In various embodiments, the through substrate opening 250 is formed after the front end of the line and the back end of the line processing. However, in some embodiments, the through substrate opening 250 is formed after the front end of the line but before forming the back end of the line layers.

Referring again to FIG. 3*a*, a high density plasma process in an RF plasma chamber is used to form a through substrate opening 250 from the top surface of the workpiece. In one embodiment, a highly anisotropic etch is used to form a through substrate opening 250 with a forward taper (top broader than bottom). In other embodiments, other types of reactive ion etch processes may be used, including processes using simultaneous bottom etch and sidewall passivation. In one embodiment, an etch step is carried out using a fluorine based plasma. However, fluorine based etches are isotropic and result in non vertical trench sidewalls. Hence, a deposition step is carried out by introducing a polymer producing gas into the plasma chamber. The polymer producing gas deposits a polymer layer on the exposed sidewalls forming a temporary etch stop layer. The polymer layer is not formed on the exposed bottom surface of the trench due to the high energy of the impinging ions. Any polymer deposited on the bottom surface of the trench is broken up by the high energy of the impinging ion. The through substrate opening etch process is carried out in sequential etch and deposition steps. A vertical trench may thus be produced. For example, the fluorine etch step may comprise an $SF_6$ etchant, whereas the polymer producing gas may comprise $C_4F_8$. The etch and deposit steps may be repeated many number of times, e.g., about 100 times to about 500 times, to form the through substrate opening 250. In other embodiments, other types of reaction ion etch processes may be used. The through substrate opening 250 after the etch step may comprise any suitable vertical shape such as cylindrical, annular, faceted, etc.

The through substrate opening 250 thus produced comprises a high aspect ratio in the range from about 1:5 to about 1:20. The top of the through substrate opening 250 comprises a width of about 2 um to about 20 um. The angle of the taper varies such that the bottom width is narrower than the top width, and is in the range from about 90 to about 80 degrees.

The through substrate opening 250 comprises a top wider section 251 for making contacts and a thinner long stem section 252 in the substrate 10. In some embodiments, the top wider section 251 may be skipped, producing a through substrate opening 250 comprising only the long stem section 252. Such an embodiment reduces the use of a masking step (for producing the top wider section 251) and reduces the cost of the fabrication process.

A sidewall liner 35 is formed on the sidewalls of the through substrate opening 250. The sidewall liner 35 in various embodiments comprises multiple layers. An outer dielectric liner 31 is formed over the sidewalls of the through substrate opening 250 and forms the outer layer of the sidewall liner 35. The outer dielectric liner 31 electrically insulates the active regions 11 from the through substrate via 1 (to be formed). The outer dielectric liner 31 may comprise silicon oxide, silicon nitride, silicon oxynitride, SiC, SiCN, a dense or porous low k or ultra low k dielectric material, an organic material or polymer like parylene, BCB, SiLK or others. In some embodiments, the outer dielectric liner 31 is anisotropically etched forming a sidewall spacer. Alternately, outer dielectric liner 31 is etched after the grinding and thinning processes that expose the bottom surface of the through substrate opening 250.

A trench liner comprising multiple metal liners is deposited over the outer dielectric liner 31 (as illustrated in the magnified top view of FIG. 1c). The trench liner is ideally conformal or at least continuous, and may comprise a single layer or layer combination of Ta, TaN, W, WN, WCN, WSi, Ti, TiN, Ru as examples. The trench liner is used, for example, as a barrier layer for preventing metal from diffusing into the underlying substrate 10 and outer dielectric liner 31. In the described embodiment, the trench liner comprises first, second, third and fourth metal liners 32, 34, 36 and 38, although in other embodiments lower or more levels of metal liners may be used. In embodiments used for power and/or RF applications, the electrical insulation using sidewall liner 35 is not required. In such embodiments, a conductive trench liner is directly formed on the sidewalls of the through substrate opening 250. Hence, as illustrated in the magnified top view of FIG. 1d, the sidewall liner 35 does not comprise the outer dielectric liner 31.

Referring to FIG. 1c, a first metal liner 32 is formed over the outer dielectric liner 31. The first metal liner 32 forms a metal diffusion barrier. If the sidewall liner process is skipped as in application for RF applications, the first metal liner 32 forms an electrical contact with the substrate 10 (FIG. 1d). The first metal liner 32 is formed using a chemical vapor deposition process or a plasma enhanced CVD process or a combination of both, although in other embodiments, other processes may be used. In one embodiment, the first metal liner 32 comprises a Ti/TiN layer. A 5-30 nm titanium layer is deposited followed by a deposition of about a 20-100 nm TiN layer.

A second metal liner 34 is formed over the first metal liner 32. The second metal liner 34 comprises a material with a low resistivity, for example, in one embodiment, comprises tungsten. The low resistive metal liner helps to minimize potential drop and hence reduce variations during the electroplating process. The second metal liner 34 is deposited using a chemical vapor deposition process, although in other embodiments, other processes such as plasma vapor deposition may be used. In various embodiments, the second metal liner 34 is deposited to a thickness of about 50 nm to about 150 nm.

A third metal liner 36 comprising a copper barrier is formed over the second metal liner 34. The third metal liner 36 is deposited to a thickness of about 100 to about 150 nm. The third metal liner 36, in various embodiments, comprises a TaN layer followed by a layer of tantalum. In one embodiment, the tantalum nitride layer is deposited to a thickness of about 20-50 nm and the tantalum layer is deposited to a thickness of about 100-150 nm.

A fourth metal liner 38 is deposited over the third metal liner 36. The fourth metal liner 38 is deposited using a plasma vapor deposition process and forms a seed layer for the electroplating process in some embodiments. The fourth metal liner 38 comprises a thickness of about 200 to about 500 nm. In various embodiments, the fourth metal liner 38 comprises copper. The sidewall liner 35 thus formed comprises the outer dielectric liner 31, the first, second, third and fourth metal liners 32, 34, 36 and 38. In various embodiments, the fourth metal liner 38 may be deposited conformally or at least continuously using, for example, a metal-organic CVD (MOCVD) process or a PVD process.

Referring next to FIG. 3b, a fill material 50 is deposited into the through substrate opening 250. The fill material 50 is electroplated over the fourth metal liner 38.

The fill material 50 comprises a conductive material, such as copper or alternatively, aluminum, tungsten, silver, gold or doped polysilicon. In various embodiments, the fill material 50 comprises copper. The fill material 50 is deposited to fill only a part of the through substrate opening 250. In one embodiment, the fill material 50 is deposited to a thickness of about 20% to about 30% the depth of the through substrate opening 250. Use of such a partial fill of the through substrate opening 250 results in a corresponding decrease in the fill time, and consequently increases the throughput of the process. The partial fill also saves the use of the expensive fill material 50, and the power intensive process of electroplating the fill material 50. Particularly at high frequencies (e.g., above 1 GHz), the resistance of a fully filled via can be significantly higher than that of a partially filled via due to skin effect. Due to a doubling of the total surface, the partially filled via offers about twice the number of modes for microwave wave propagation, providing a further advantage of reducing the Ohmic resistance by almost half at high operational frequencies. In one embodiment, the thickness of the fill material 50 is about 2 um to about 5 um.

Referring next to FIG. 3c, the top surface of the wafer is planarized to expose the first insulating layer 30. In various embodiments, the planarization process comprises a chemical mechanical polishing (CMP). The CMP process removes the fill material 50 and the underlying sidewall liner 35. After polishing through the fill material 50, the CMP process removes the first, second, third and fourth metal liners 32, 34, 36 and 38. In various embodiments, the polishing process stops on the first insulating layer 30. A post CMP clean is next performed to remove the slurry residuals from the open through substrate opening 250.

As illustrated next in FIG. 3d, an etch stop liner is deposited over the top surface of the through substrate opening 250. A first dielectric liner 41 is deposited on the sidewalls and bottom surface of the fill material 50. The first dielectric liner 41 is deposited using a plasma enhanced deposition process such as a PECVD process, although in other embodiments, other suitable deposition processes may be used. The first dielectric liner 41 comprises a nitride material, in one embodiment. The first dielectric liner 41 comprises a thickness of about 200 nm to about 500 nm, and about 400 nm in one embodiment. A second dielectric liner 42 is deposited over the first dielectric liner 41. The second dielectric liner 42 comprises a thickness of about 50 nm to about 150 nm. The second dielectric liner 42 comprises a carbon containing layer in various embodiments. In one embodiment, the second dielectric liner 42 comprises a pyrolytic carbon layer. In other embodiments, oxide CMP stop layer such as SiN or SiC may be used as the second dielectric liner 42. As discussed below, the second dielectric liner 42 forms a protective stop layer during the subsequent polishing process.

As illustrated in FIG. 3e, a second insulating layer 60 is deposited over the second dielectric liner 42. The second insulating layer 60 is deposited using a highly anisotropic deposition process, for example, accomplished by using a plasma process. Hence, the second insulating layer 60 deposits non-conformally and does not deposit along the sidewalls of the through substrate opening 250. The second insulating layer 60, in one embodiment, comprises an oxide layer formed from oxidizing silane. The process conditions for the second insulating layer 60 are chosen to form a gap 'g' in a top portion of the through substrate opening 250. In various embodiments, the gap g is tailored to be about 1 um to about 3 um. For example, in one embodiment, this gap 'g' is about 2 um.

Referring next to FIG. 3f, a third insulating layer 70 is deposited over the second insulating layer 60. In various embodiments, the third insulating layer 70 is deposited using a process that deposits, for example, ions at high velocity. Hence, in various embodiments, the third insulating layer 70 is deposited using a plasma/plasma enhanced process. In one embodiment, a plasma enhanced chemical vapor deposition process is used to deposit an oxide layer. In another embodiment, a high density plasma process is used to form the third insulating layer 70. The third insulating layer 70 fills the gap 'g' and forms the tailored void 90. In various embodiments the pinch-off point 71 is within the through substrate opening 250. This ensures that the tailored void 90 is protected and the seal is not etched off during subsequent processing. In various embodiments, the third insulating layer 70 is an oxide layer.

Referring next to the FIG. 3g, a polishing process is used to planarize the third insulating layer 70. The polishing process, in various embodiments, comprises a CMP process. The CMP process is stopped on the second dielectric layer and polishes and removes the third insulating layer 70 and the underlying second insulating layer 60.

As next illustrated in FIG. 3h, a selective etch process is used to remove the second dielectric liner 42 and the underlying first dielectric liner 41. For example, a carbon ash process is used to remove a second dielectric liner 42 comprising carbon to expose the first insulating layer 30.

Referring to FIG. 3i, a fourth insulating layer 80 is deposited over the first insulating layer 30. The fourth insulating layer 80 is also deposited over the third insulating layer 70. The fourth insulating layer 80 is deposited using a CVD process such as PECVD, and comprises a nitride layer in various embodiments.

The substrate 10 is subsequently processed using conventional processing to form back end of the line metallization layer, bond pads and final passivation layers. In other embodiments, the through substrate via 1 is fabricated after fabricating the back end of the line metallization layer. In such embodiments, the through substrate via 1 is fabricated either before or after forming the bond pads. In some embodiments, the through substrate via 1 is fabricated before the active devices are fabricated in the front end of the line.

The substrate 10 is subsequently thinned exposing a lower surface by grinding to a desired thickness. The typical thickness of the substrate 10 after the thinning is about 10 µm to about 150 µm. In different embodiments, the thinning may also be performed chemically or using a plasma. For example, a modified plasma etch may be used to thin the silicon wafer from the back side. Such techniques have the additional advantage of not damaging the front side. The advantage of thinning the semiconductor wafer (or semiconductor chip, if the semiconductor wafer has already been diced) is to shorten the length of the through-vias, which enhances the electric properties and creates a via with a relatively vertical sidewall.

Figure 5A:
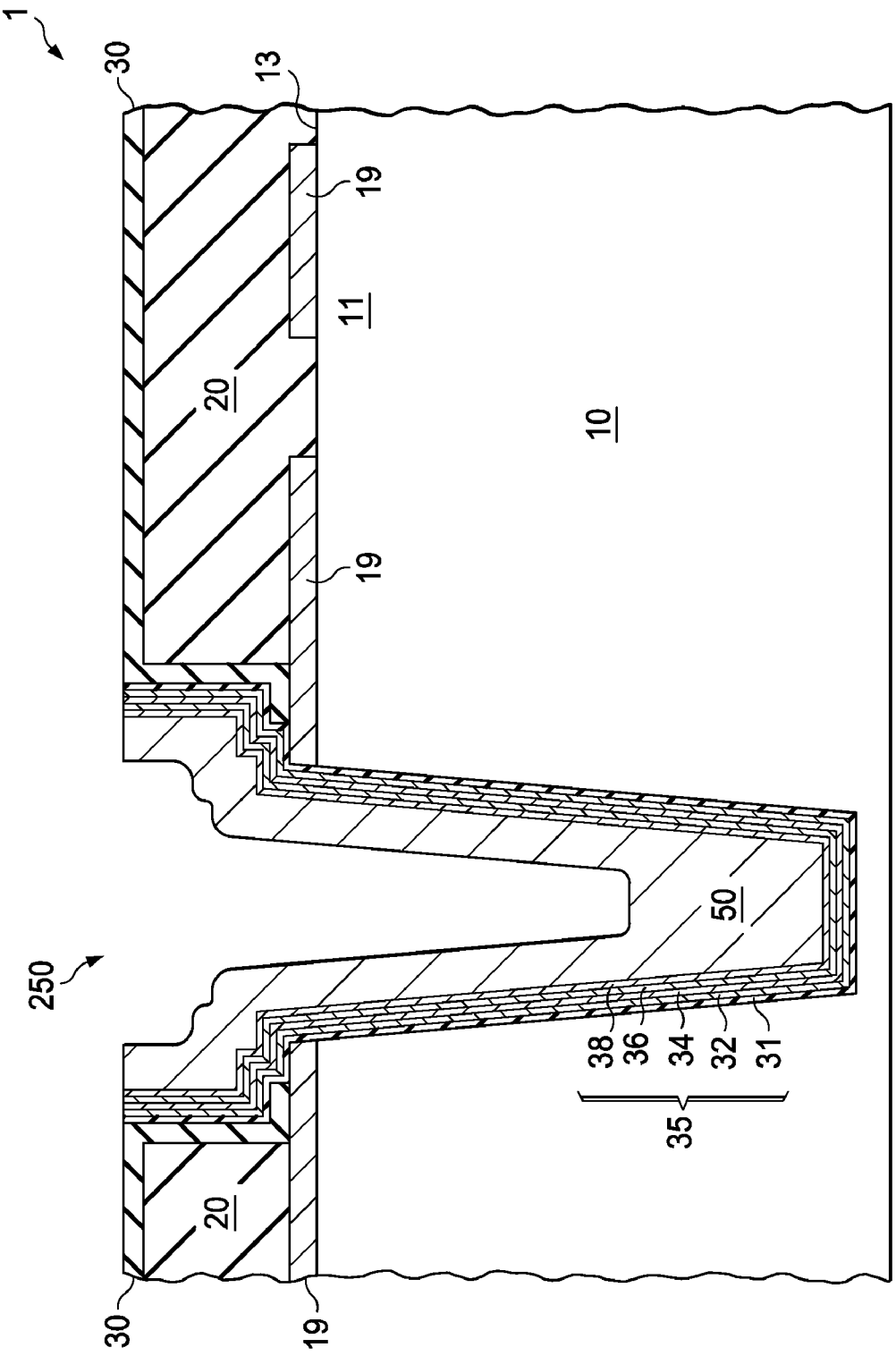
FIGS. 5a-5e, illustrates a method of manufacturing a through substrate via chip according to embodiments of the invention.
Figure 5B:
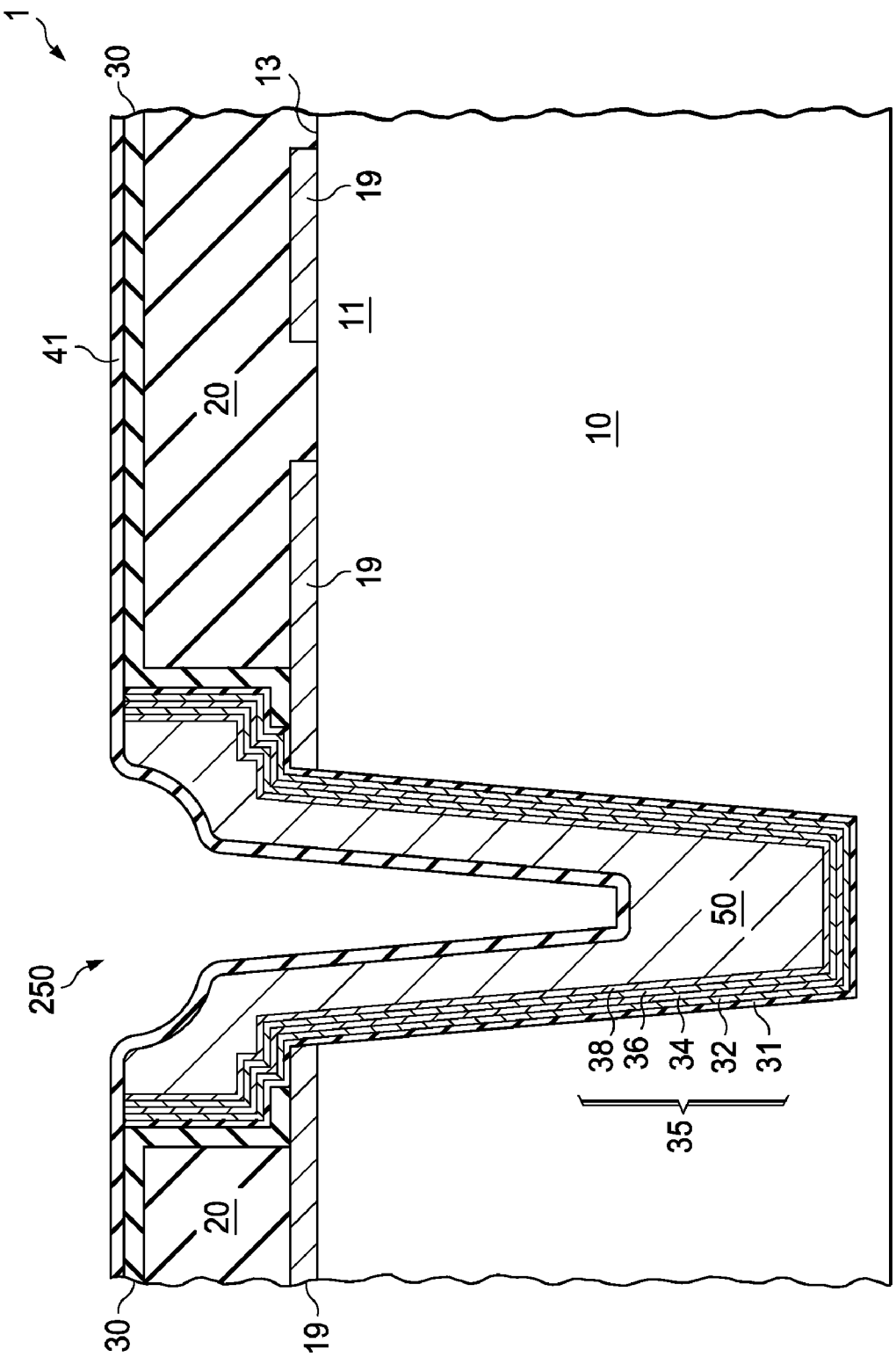
Figure 5C:
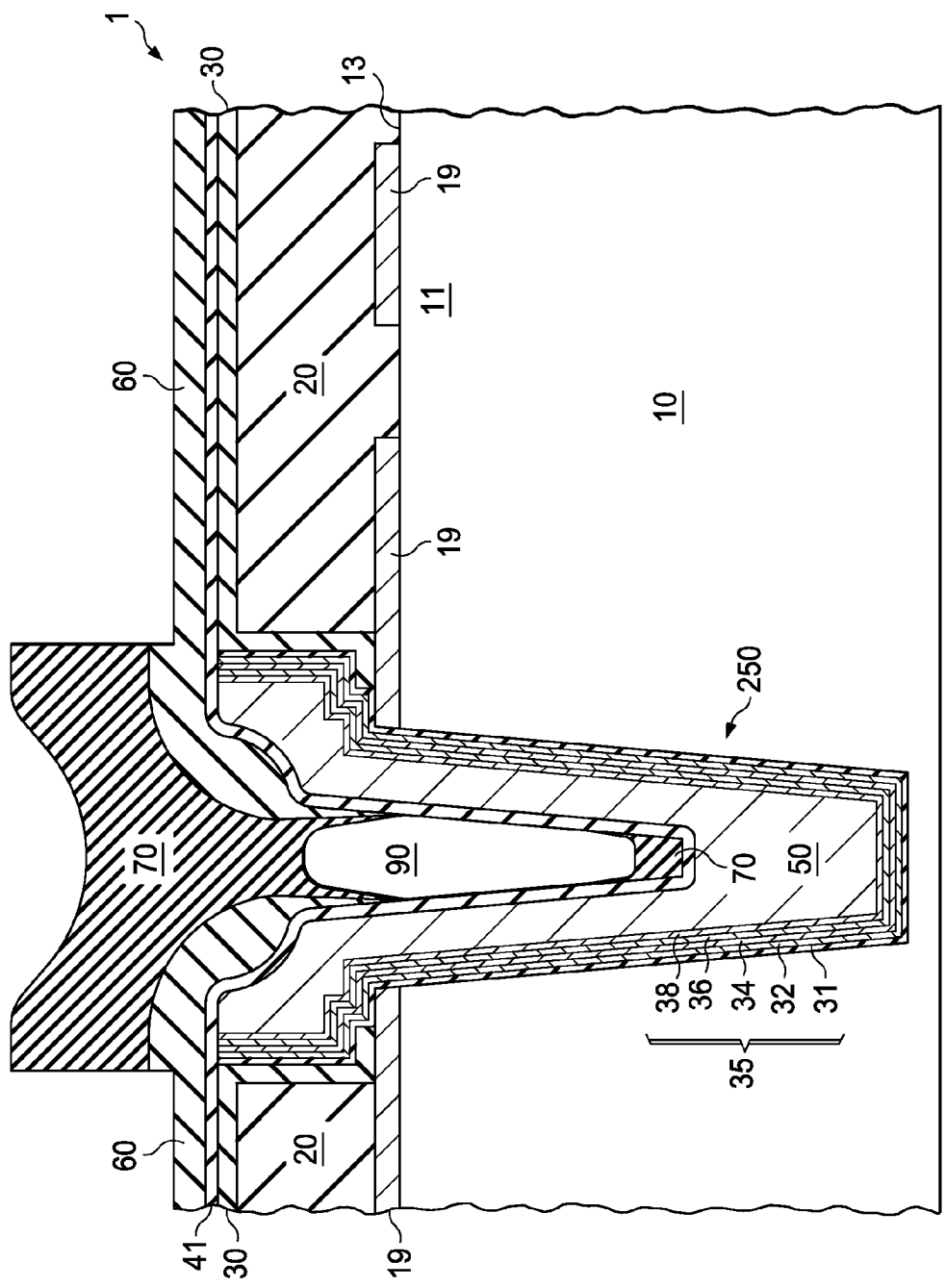
Figure 5D:
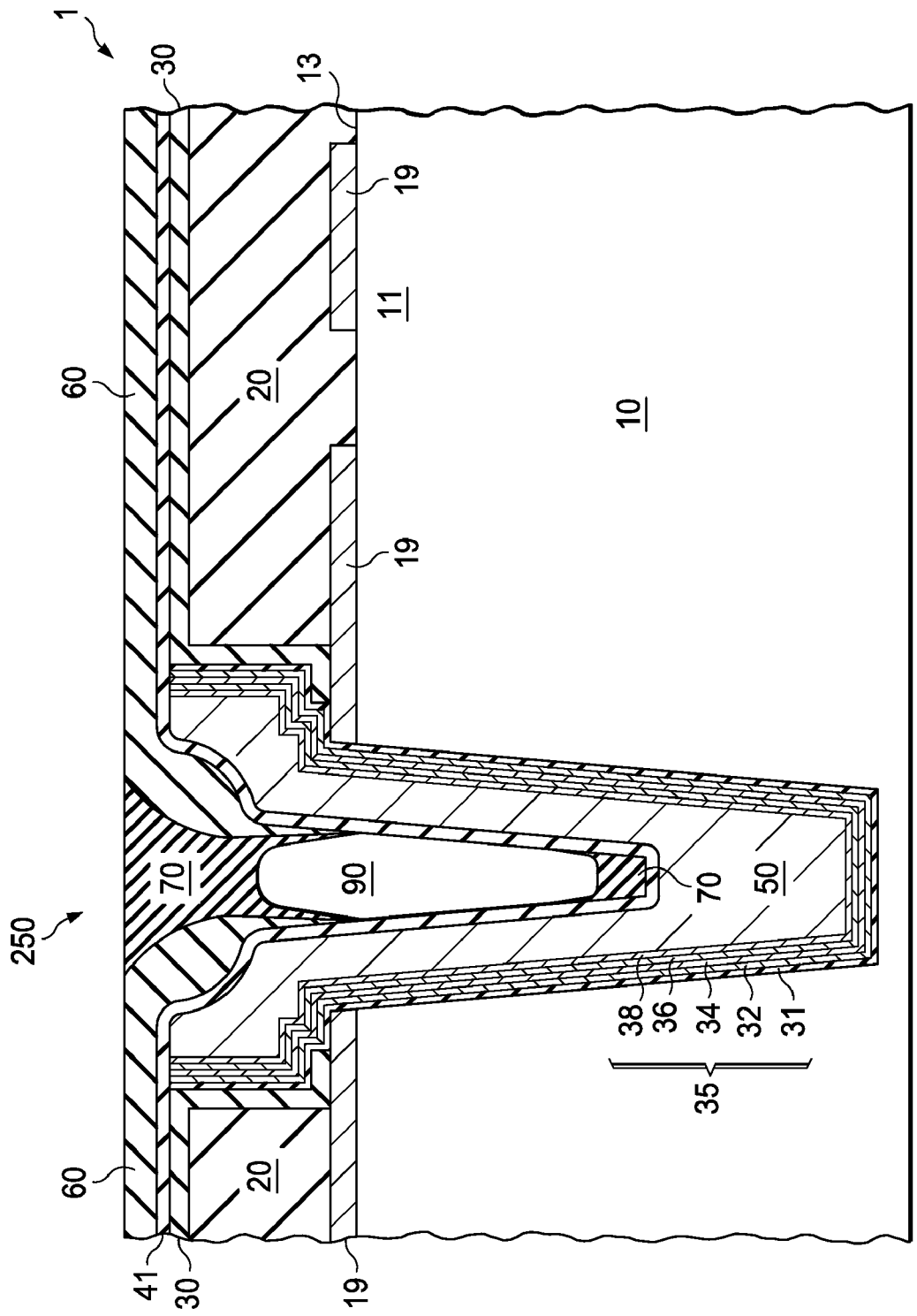
Figure 5E:
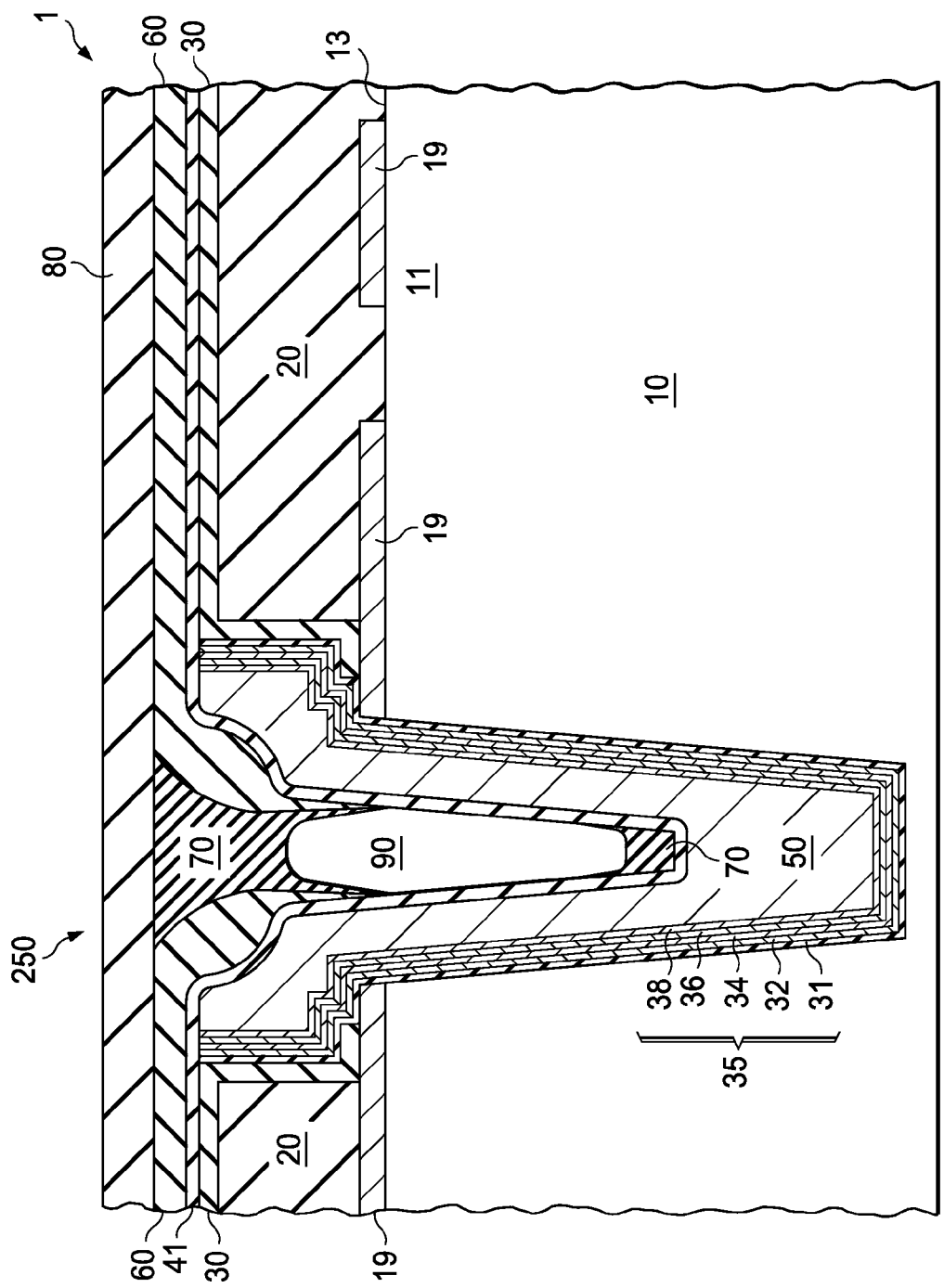
Figure 6:
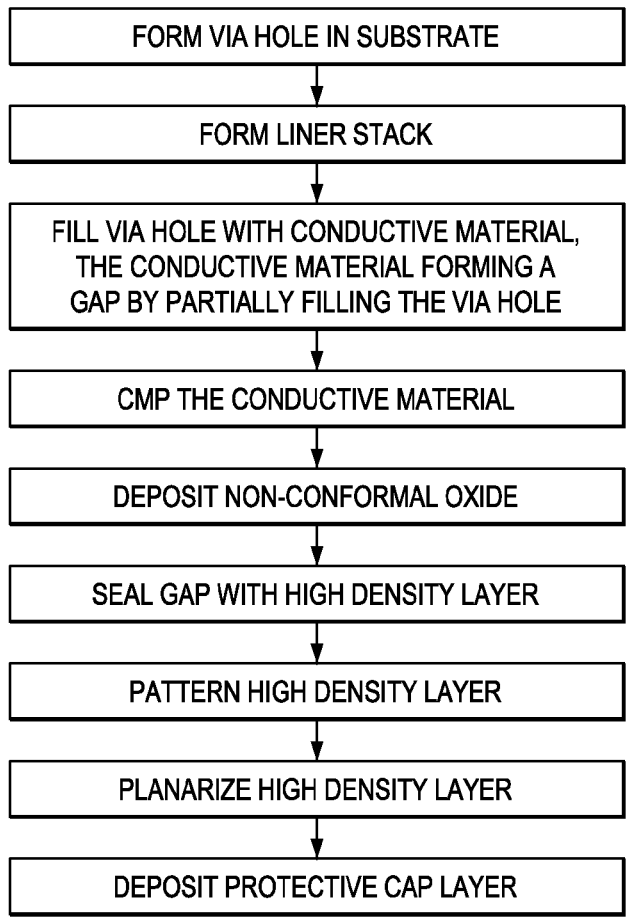
FIG. 6 is a flow chart of a method of forming the through substrate via chip according to an embodiment of the invention.

An embodiment of a method of fabrication of the through substrate via 1 is illustrated using FIG. 5, which includes FIGS. 5a-5e, and the flow chart of FIG. 6.

Referring to FIG. 5a, the process follows the steps described in the previous embodiment with respect to FIGS. 3a-3c. As next illustrated in FIG. 5b, a first dielectric liner 41 is deposited over the sidewalls and the bottom surface of the through substrate opening 250. However, unlike the prior embodiment, a second dielectric liner 42 is not deposited.

Referring next to FIGS. 5c and 5d, a third insulating layer 70 is deposited and patterned. A second insulating layer 60 is deposited as described with respect to FIG. 3e. Next, a third insulating layer 70 is deposited as described with respect to FIG. 3f. However, unlike the prior embodiment, a separate lithography step is used to pattern the third insulating layer 70. The third insulating layer 70 is patterned such that a region directly above the through substrate opening 250 that is now filled by the third insulating layer 70 is not etched. The patterned third insulating layer 70 is polished, for example, using a CMP process. As illustrated in FIG. 5e, a fourth insulating layer 80 is deposited as described with respect to FIG. 3i.

Figure 8:
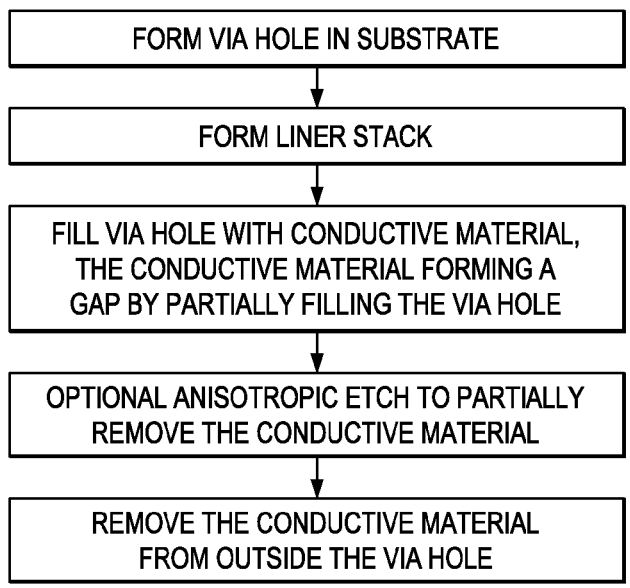
FIG. 8 is a flow chart of a method of forming the through substrate via chip according to an embodiment of the invention.
Figure 7A:
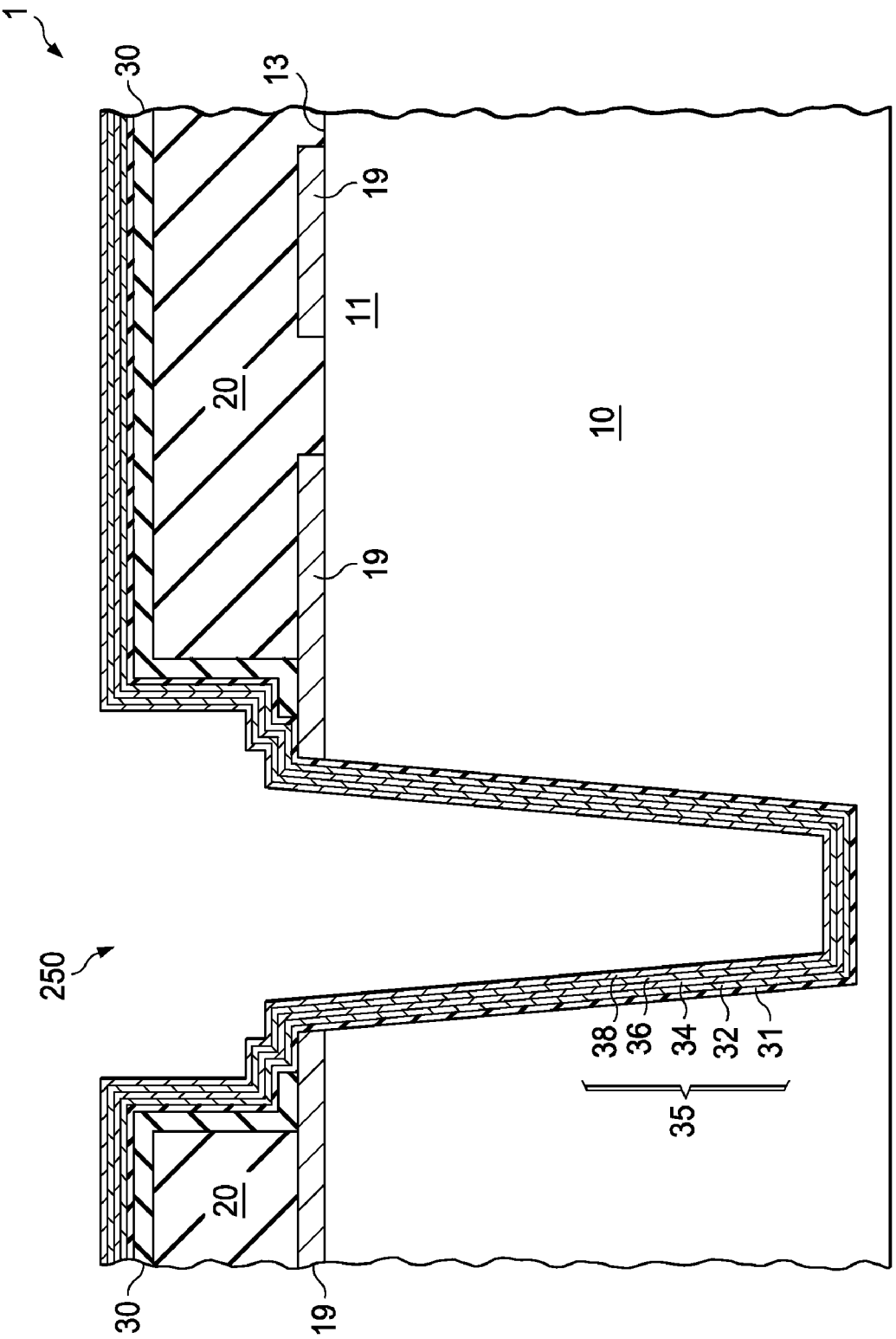
FIGS. 7a-7d, illustrates a method of manufacturing a through substrate via chip according to embodiments of the invention.
Figure 7B:
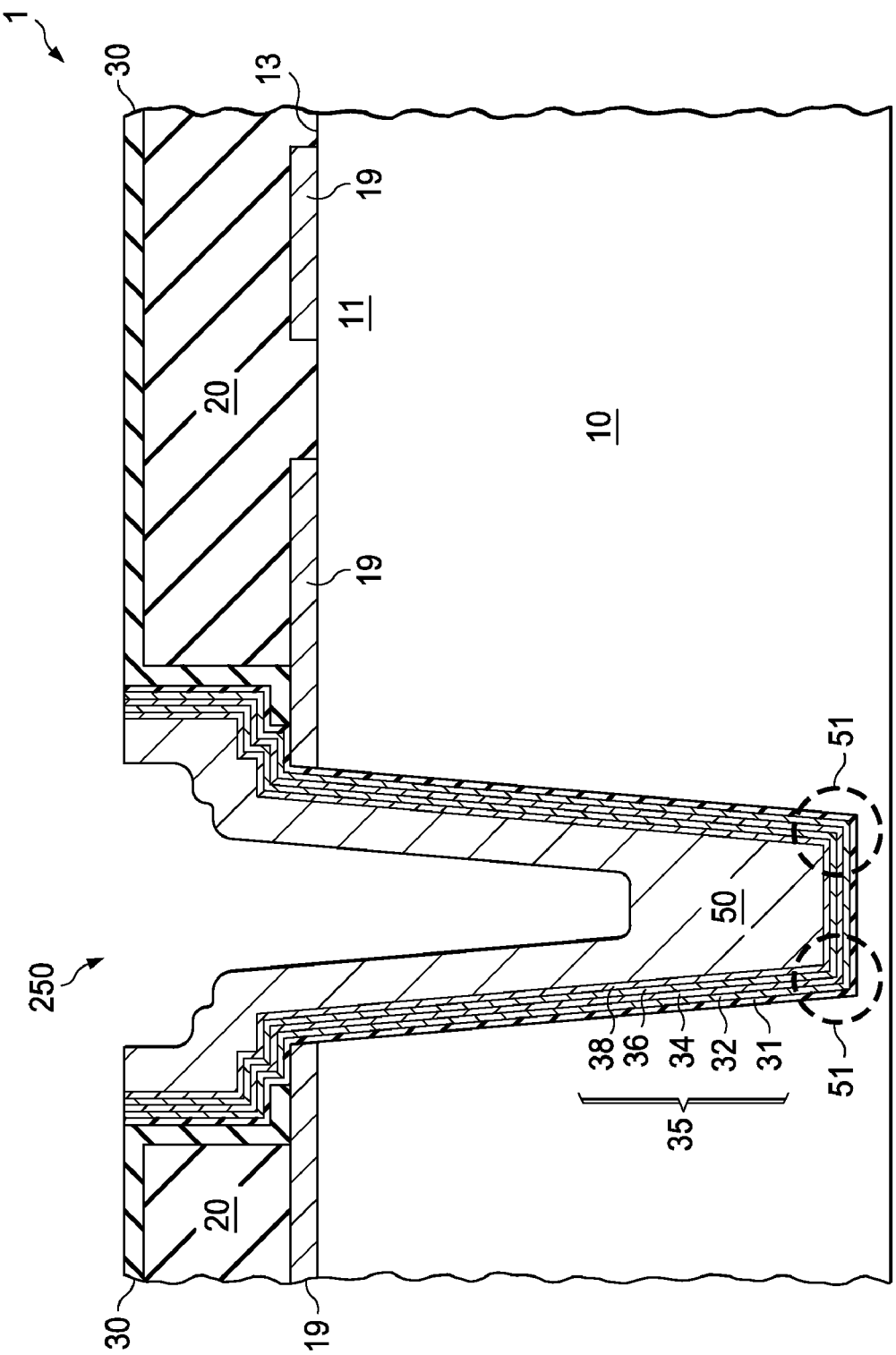
Figure 7C:
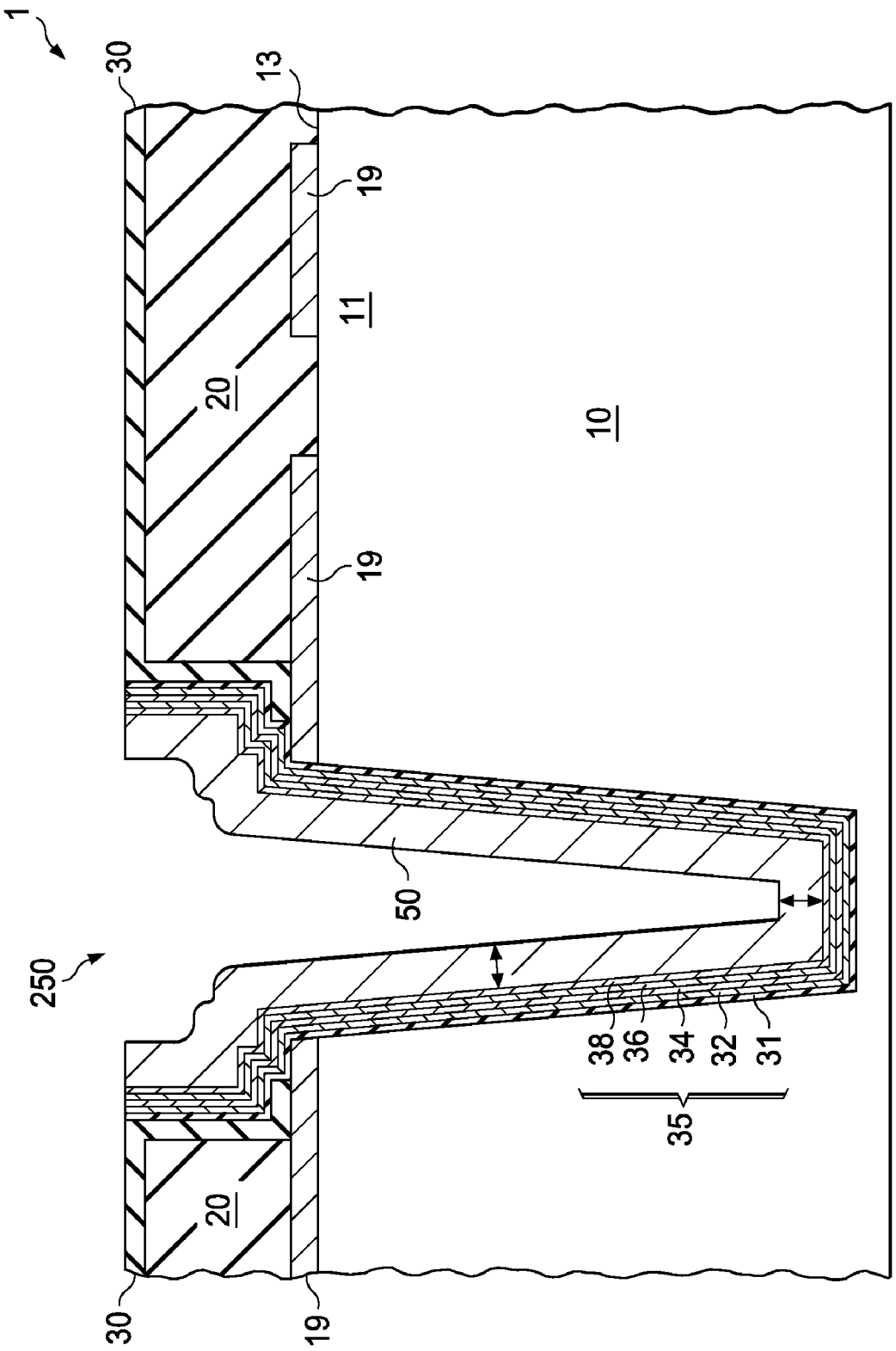

An embodiment of a method of fabrication of the through substrate via 1 is illustrated using FIG. 7, which includes FIGS. 7a-7c, and the flow chart of FIG. 8.

The through substrate opening 250 is formed as described with respect to FIG. 3a. Further, as illustrated in FIG. 7a, and as described with respect to FIG. 3a, the sidewall liner 35 comprising the outer dielectric liner 31, the first, second, third and fourth metal liners 32, 34, 36 and 38 are deposited conformally.

Referring to FIG. 7b and as described in FIG. 3b, a fill material 50 is deposited to partially fill the through substrate opening 250. In various embodiments, the fill material 50 is deposited to form an optimum shape that minimizes stress concentration regions.

In various embodiments, the fill material 50 is electroplated over the fourth metal liner 38. In conventional electroplating processes, the super-fill effect is maximized to fill the bottom trench without forming voids. However, such structures with bottom fills produce high local stress regions 51 at the base of the through substrate opening 250 during subsequent processing. In different embodiments, this is avoided by tailoring the shape of the fill material 50 lining the through substrate opening 250.

In one embodiment, the super-fill effect is reduced relative to other conventional trench filling processes. Super-fill effect fills the high aspect ratio trenches or openings due to a preferential deposition on the bottom surface, permitting the bottom surface to rise before the sidewalls close off. However, since only a partial fill of the trench is required in various embodiments, the super-fill effect is tailored to form a fill material 50 comprising a specific optimum shape. For example, the deposition rate on the bottom surface of the through substrate opening 250 is reduced. In various embodiments, this is accomplished by reducing the super-fill effect that concentrates accelerators near the bottom surface during the electroplating process.

Figure 7D:
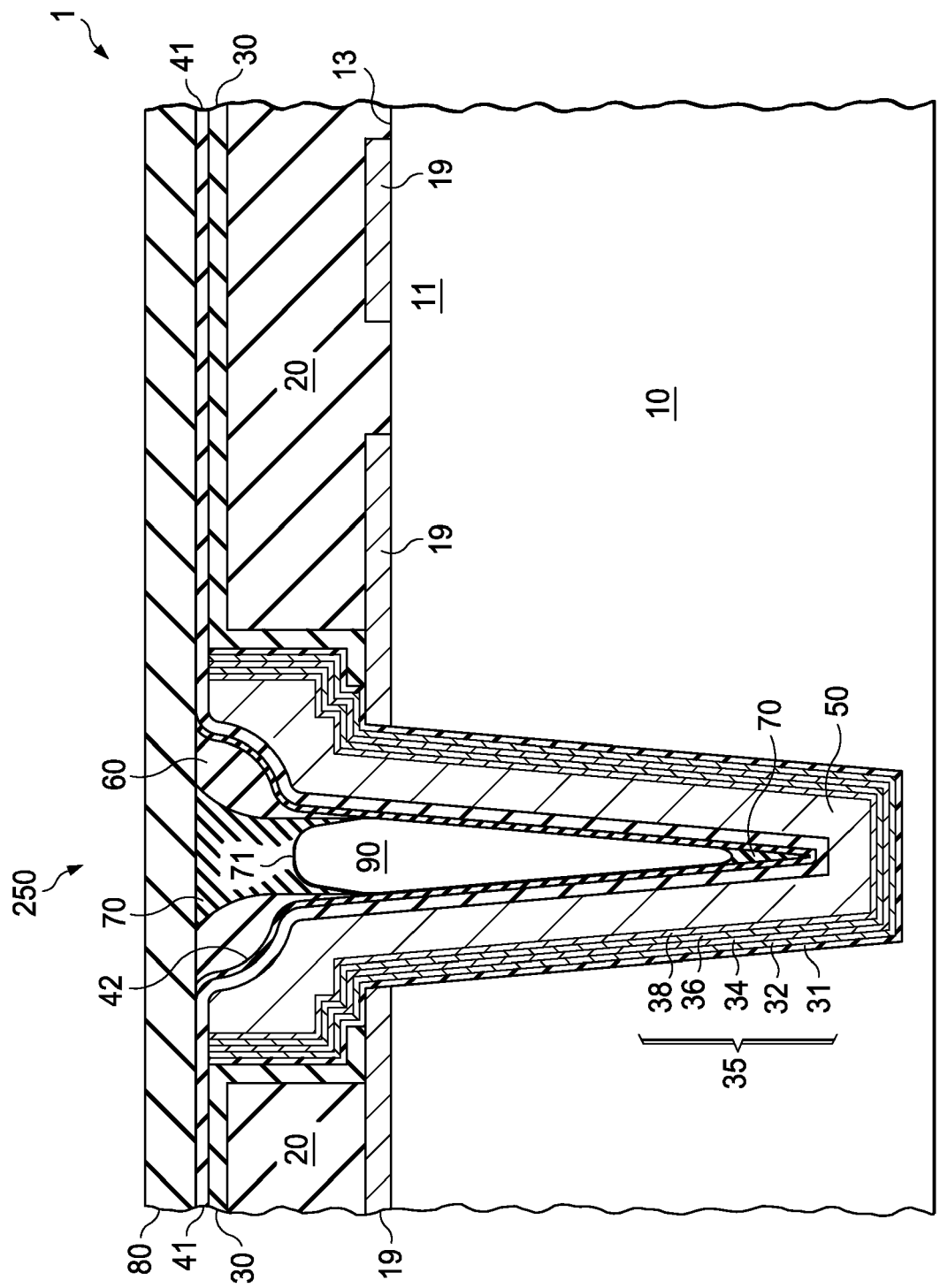

Optionally, as illustrated in FIG. 7c, an additional anisotropic etch may be performed in some embodiments to reduce the thickness of the fill material 50 on the bottom surface of the openings 250. Subsequent processing proceeds as discussed with respect to FIGS. 3c-3i. Referring to FIG. 7d, the tailored void 90 thus formed comprises dimensions that are tailored to minimize stress concentration during, for example, subsequent thermal cycling. In other embodiments, other suitable processes such as catalyst enhanced chemical vapor deposition may also be used to form the fill material 50.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A through substrate via comprising:
a conductive fill material disposed over sidewalls of a via opening such that an enclosed cavity is disposed within the via opening, the via opening extending through a workpiece;
a first insulating layer disposed within a top portion of the via opening; and
a second insulating layer disposed between sidewalls of the first insulating layer and above the enclosed cavity.

2. The through substrate via of claim 1, further comprising a fill material disposed inside the via opening, the fill material disposed over the sidewalls of the via opening.

3. The through substrate via of claim 2, wherein sidewalls and a bottom surface of the fill material bound the enclosed cavity.

4. The through substrate via of claim 2, wherein the fill material comprises copper.

5. The through substrate via of claim 1, wherein the enclosed cavity comprises a gas, the gas comprising air or an inert gas.

6. The through substrate via of claim 5, wherein pressure of the gas in the enclosed cavity is about 0.1 to about 1 atmospheric pressure.

7. The through substrate via of claim 1, wherein the first insulating layer comprises a nitride material, and wherein the second insulating layer comprises an oxide material.

8. A semiconductor component comprising:
a opening disposed in a workpiece, the opening extending from a top surface of the workpiece to an opposite bottom surface;
a conductive fill material disposed over sidewalls of the opening;
a dielectric liner disposed over sidewalls of the conductive fill material;
a first insulating layer disposed over the conductive fill material in a top portion of the opening; and
an enclosed cavity disposed in a remaining bottom portion of the opening, wherein a second insulating layer is disposed in the top portion of the opening, the second insulating layer enclosing the enclosed cavity and disposed between opposite sidewalls of the first insulating layer.

9. The semiconductor component of claim 8, further comprising a conductive liner disposed within and lining the opening.

10. The semiconductor component of claim 9, wherein the conductive liner comprises a first conductive liner, a second conductive liner, a third conductive liner, and a fourth conductive liner.

11. The semiconductor component of claim 10, wherein the first conductive liner comprises Ti/TiN layer, wherein the second conductive liner comprises W, wherein the third conductive liner comprises TaN, and wherein the fourth conductive liner comprises copper.

12. The semiconductor component of claim 8, wherein the conductive fill material comprises copper.

13. The semiconductor component of claim 8, wherein the enclosed cavity comprises a gas, the gas comprising air or an inert gas.

14. The semiconductor component of claim 13, wherein pressure of the gas in the enclosed cavity is about 0.1 to about 1 atmospheric pressure.

15. The semiconductor component of claim 8, wherein the first insulating layer comprises a nitride material, and wherein the second insulating layer comprises an oxide material.

16. The semiconductor component of claim 8, wherein the first insulating layer comprises a nitride material, and wherein the second insulating layer comprises an high density plasma oxide material.

17. A semiconductor component comprising:
an opening in a substrate partially filled with a fill material;
a first insulating layer disposed over the fill material; and
an enclosed cavity, a top portion of the enclosed cavity being sealed by a second insulating layer disposed between the first insulating layer.

18. The semiconductor component of claim 17, further comprising a dielectric liner disposed over sidewalls of the fill material, wherein the dielectric liner encloses side surfaces of the enclosed cavity.

19. The semiconductor component of claim 18, wherein the first insulating layer is disposed on the dielectric liner.

20. The semiconductor component of claim 17, further comprising:
a first dielectric liner disposed over sidewalls of the fill material; and
a second dielectric liner disposed over the first dielectric liner, wherein the second dielectric liner encloses side surfaces of the enclosed cavity.

21. The semiconductor component of claim 20, wherein the first insulating layer is disposed on the second dielectric liner.

22. The semiconductor component of claim 17, further comprising a conductive liner disposed lining the opening, the conductive liner being disposed under the fill material.

23. The semiconductor component of claim 22, wherein the conductive liner comprises a first conductive liner, a second conductive liner, a third conductive liner, and a fourth conductive liner.

24. The semiconductor component of claim 23, wherein the first conductive liner comprises Ti/TiN layer, wherein the second conductive liner comprises W, wherein the third conductive liner comprises TaN, wherein the fourth conductive liner comprises copper, and wherein the fill material comprises copper.

25. The semiconductor component of claim 17, wherein the enclosed cavity comprises a gas, the gas comprising air or an inert gas and wherein pressure of the gas in the enclosed cavity is about 0.1 to about 1 atmospheric pressure.

* * * * *